United States Patent
Chen et al.

(10) Patent No.: US 10,151,971 B2
(45) Date of Patent: Dec. 11, 2018

(54) SYSTEM FOR AND METHOD OF SEEDING AN OPTICAL PROXIMITY CORRECTION (OPC) PROCESS

(71) Applicant: TAIWAN SEMICONDUCTOR MANUFACTURING COMPANY, LTD., Hsinchu (TW)

(72) Inventors: Yin-Chuan Chen, Taichung (TW); Chi-Ming Tsai, Taipei (TW); Shin-Huang Chen, Puli Town (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 30 days.

(21) Appl. No.: 15/200,195

(22) Filed: Jul. 1, 2016

(65) Prior Publication Data
US 2018/0004079 A1 Jan. 4, 2018

(51) Int. Cl.
*G06F 17/50* (2006.01)
*G03F 1/36* (2012.01)

(52) U.S. Cl.
CPC ............ *G03F 1/36* (2013.01); *G06F 17/5081* (2013.01)

(58) Field of Classification Search
USPC .................................. 716/51, 52, 53, 54, 55
See application file for complete search history.

(56) References Cited

U.S. PATENT DOCUMENTS

| | | | |
|---|---|---|---|
| 6,347,258 B1 | 2/2002 | Hsu et al. | |
| 6,795,955 B2 | 9/2004 | MacLean et al. | |
| 6,807,663 B2 | 10/2004 | Cote et al. | |
| 7,308,655 B2 | 12/2007 | Chu et al. | |
| 7,386,433 B2 | 6/2008 | MacLean et al. | |
| 7,418,693 B1 * | 8/2008 | Gennari | G06F 17/5068 716/55 |
| 7,512,924 B2 | 3/2009 | Chen et al. | |
| 7,908,572 B2 | 3/2011 | Zhang | |
| 7,966,596 B2 | 6/2011 | Lu et al. | |
| 8,372,742 B2 | 2/2013 | Cheng et al. | |
| 8,473,888 B2 | 6/2013 | Guo et al. | |

(Continued)

OTHER PUBLICATIONS

Bin Lin et al., "A sparse matrix model-based optical proximity correction algorithm with model-based mapping between segments and control sites", Journal of Zhejiang University—Science C (Computers & Electronics), May 2011, vol. 12, Issue 5, pp. 436-442; ISSN 1869-1951 (Print); ISSN 1869-196X (Online) www.zju.edu.cn/jzus; www.springerlink.com; First online: May 15, 2011.

*Primary Examiner* — Brian Ngo
(74) *Attorney, Agent, or Firm* — Hauptman Ham, LLP

(57) ABSTRACT

A method, of seeding an optical proximity correction (OPC) process, includes: receiving, at an input device of a computer, a subject pre-OPC design-signature for a subject pre-OPC design package; selecting, by the processor and via interaction with an OPC database operatively connected to the computer, one amongst archived post-OPC design packages based on relatedness between the subject pre-OPC design-signature and archived post-OPC design-signatures corresponding to the archived post-OPC design packages, and thereby retrieving the selected archived post-OPC design packages; and generating one or more seeds for the OPC process based on the selected archived post-OPC design package.

20 Claims, 9 Drawing Sheets

(56) References Cited

U.S. PATENT DOCUMENTS

| | | | |
|---|---|---|---|
| 8,601,416 | B2 | 12/2013 | Kuo et al. |
| 8,627,241 | B2 | 1/2014 | Wang et al. |
| 8,762,900 | B2 | 6/2014 | Shin et al. |
| 8,775,993 | B2 | 7/2014 | Huang et al. |
| 8,887,116 | B2 | 11/2014 | Ho et al. |
| 8,943,445 | B2 | 1/2015 | Chen et al. |
| 8,984,459 | B2 | 3/2015 | Chen et al. |
| 8,990,762 | B2 | 3/2015 | Yuh et al. |
| 9,081,933 | B2 | 7/2015 | Liu et al. |
| 9,183,341 | B2 | 11/2015 | Chen et al. |
| 9,213,790 | B2 | 12/2015 | Hsu et al. |
| 9,262,578 | B2 | 2/2016 | Wang et al. |
| 2006/0058903 | A1 | 3/2006 | Chang et al. |
| 2007/0055953 | A1* | 3/2007 | Fang ................. G03F 1/36 716/52 |
| 2008/0244475 | A1 | 10/2008 | Lo et al. |
| 2011/0197168 | A1 | 8/2011 | Chen et al. |
| 2013/0198712 | A1* | 8/2013 | Koranne ............ G06F 17/5081 716/119 |
| 2014/0013287 | A1 | 1/2014 | Cheng et al. |
| 2014/0237435 | A1 | 8/2014 | Chen et al. |
| 2014/0304670 | A1 | 10/2014 | Su et al. |
| 2015/0278419 | A1 | 10/2015 | Yang et al. |
| 2015/0370937 | A1 | 12/2015 | Liu et al. |
| 2015/0370945 | A1 | 12/2015 | Lee |
| 2016/0042108 | A1 | 2/2016 | Ho et al. |

\* cited by examiner

SYSTEM FOR AND METHOD OF SEEDING AN OPTICAL PROXIMITY CORRECTION (OPC) PROCESS

BACKGROUND

Various electronic design automation (EDA) tools generate, optimize and verify designs for semiconductor devices while ensuring that the design and manufacturing specifications are met. In near-wavelength and sub-wavelength photolithography, other EDA tools use optical proximity correction (OPC) and thereby modify photolithographic masks for integrated circuits (ICs). OPC includes rule-based OPC and model-based OPC. Note that the term OPC as used herein can generically refer to proximity effect corrections, e.g. for resist, etch, and micro-loading.

Typically, OPC is performed toward the end of the chip design process, at a point at which a design package of an integrated circuit (IC) (which includes one or more devices and/or one or more circuit elements represented as multiple physical layout layers) is ready for dissection into segments. In general, compared to rule-based OPC, model-based OPC provides higher accuracy but is computationally more expensive and takes significantly more time to process each of the multiple physical layout layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. Moreover, the dimensions of the various features may be arbitrarily increased or reduced for clarity of discussion.

DETAILED DESCRIPTION

Figure 1A:
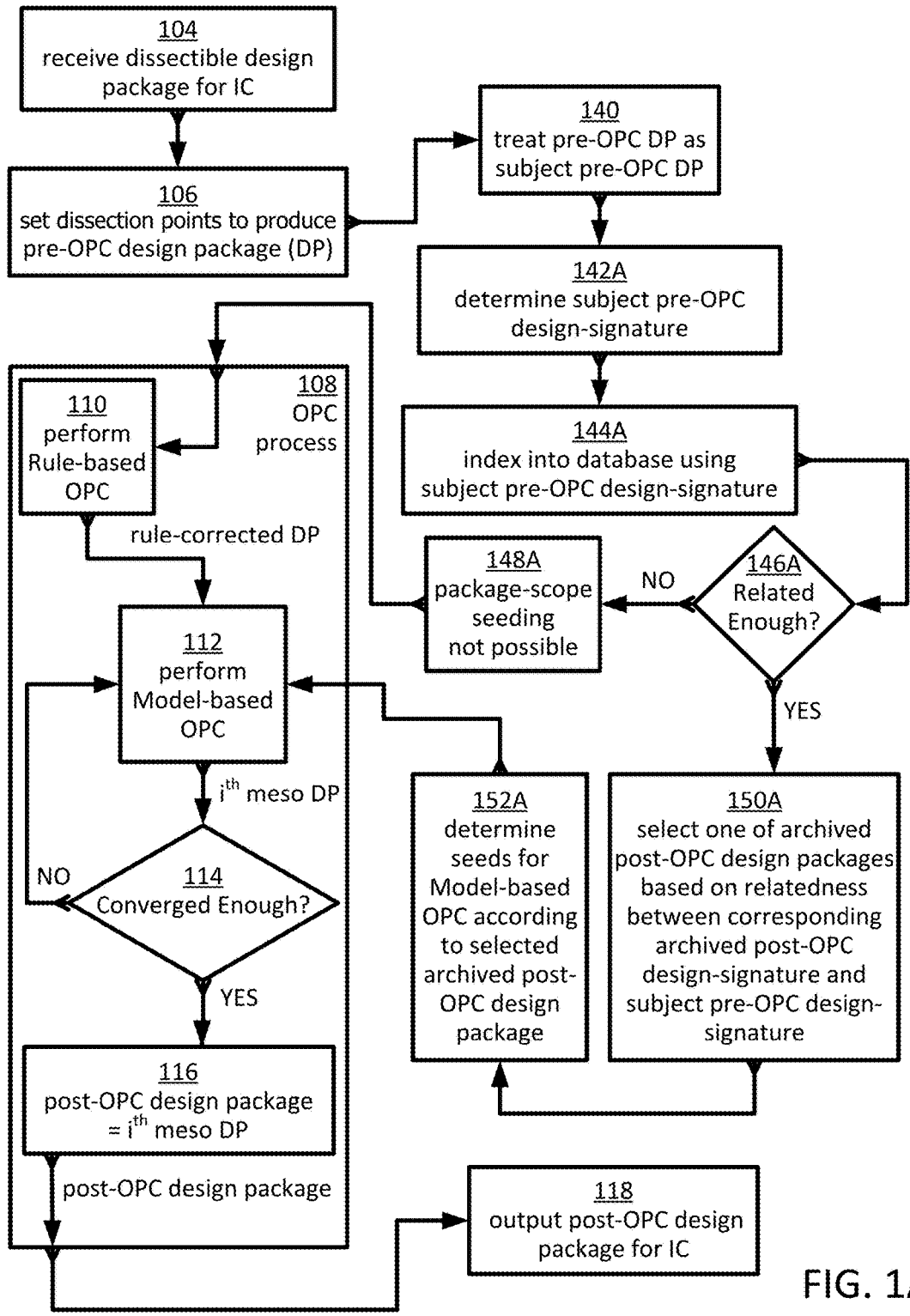
FIG. 1A is a flowchart of a method of seeding an optical proximity correction (OPC) process in accordance with at least one embodiment of the present disclosure.

The following disclosure provides many different embodiments, or examples, for implementing different features of the provided subject matter. Specific examples of components, materials, values, steps and/or arrangements are described below to simplify the present disclosure. These are, of course, merely examples and are not intended to be limiting. Other components, materials, values, steps and/or arrangements are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The term mask, photolithographic mask, photomask and reticle are used to refer to the same item.

In some embodiments, each layout layer in a pre-OPC design package of an IC is a hierarchical collection of basic layout elements (BLEs) (a type of cell), where each BLE is represented by one or more segments. Model-based OPC is an iterative process which converges towards an acceptable level of correction over time. With each iteration, OPC correction values (OPC bias values) are refined for the entire design package. The iterative OPC process proceeds until a convergence criterion is satisfied. For some iterative methods, such as some root-finding algorithms, the initial iteration operates upon a guess at the solution. The better the guess, the quicker the convergence to the solution. As the default guesses upon which the initial iteration will operate, the OPC process assumes OPC correction values of zero. At least some embodiments of the present disclosure provide better guesses than the default guesses. The present disclosure refers to the better guesses for the OPC process as seeds, and to providing the seeds to the first iteration of the OPC process as the process of seeding. Such seeds are used to accelerate or jumpstart the convergence of the OPC process.

Within each iteration, model-based OPC proceeds sequentially, not only on a cell-by-cell basis, and not only on a BLE-by-BLE basis, but on a segment-by-segment basis. Without seeding, model-based OPC is a bottleneck during the manufacture of the IC. Even with cell-scope seeding, model-based OPC is a bottleneck which exhibits unacceptable turn-around-times (TATs). By contrast, package-scope seeding reduces the number of iterations of model-based OPC, and thus reduces the TAT associated with model-based OPC.

In some embodiments, a method of package-scope seeding an OPC process includes: receiving a subject pre-OPC design-signature for a subject pre-OPC design package; selecting one amongst archived post-OPC design packages based on relatedness between the subject pre-OPC design-signature and archived post-OPC design-signatures corresponding to the archived post-OPC design packages, and thereby retrieving the selected archived post-OPC design packages; and generating one or more seeds for the OPC process based on the selected archived post-OPC design package.

FIG. 1A is a flowchart of method of seeding an optical proximity correction (OPC) process in accordance with at least one embodiment of the present disclosure.

FIG. 1A relates to package-scope seeding (discussed below) whereas FIG. 1B (discussed below) relates to layer-scope seeding (discussed below). In some embodiments, the method of FIG. 1A is implemented as a software application comprising computer program code for execution by a processor that is used by an EDA (again, electronic design automation) tool.

In FIG. 1A, in some embodiments, a dissectible design package is received at a block 104. In some embodiments, a dissectible design package is a design package of an integrated circuit (IC) (including one or more devices and/or one or more circuit elements) that is ready for dissection (the design package has been refined to a point at which it is appropriate to subject the design package to dissection). In some embodiments, the edges of a feature in a layout are divided (or dissected) into a plurality of segments (e.g., see block 106, discussed below), and then model-based OPC (e.g., see blocks 112-114, discussed below) operates on the segments to correct for proximity effects (a type of optical distortion) by moving the segments individually. In some embodiments, a design package includes one or more data files representing multiple physical layout layers, where each layout layer is a cell-based representation of a layout.

In some embodiments, the dissectible design package is received from a designer. In some embodiments, the designer is a separate design house. In some embodiments, the designer is part of a semiconductor fabrication facility (fab). The fab manufactures ICs according to an OPC-adjusted version of the dissectible design package, namely a post-OPC design package (discussed below). For example, the semiconductor fab is capable of making photomasks, semiconductor wafers, or both.

In some embodiments, the dissectible design package includes various geometrical patterns designed for an IC-based product and configured according to a specification of the IC-based product. In some embodiments, the dissectible design package is presented in one or more data files which include information representing the geometrical patterns. In some embodiments, the dissectible design package includes at least one cell-based representation of a layout-layer. In some embodiments, the dissectible design package is in a database file format, e.g., Graphic Data System (GDS II), Open Artwork System Interchange Standard (OASIS), or other similar file formats.

In some embodiments, the dissectible design package includes multiple physical layout layers, for example, where each layout layer is a cell-based representation of a layout layer. In some embodiments, each cell-based representation of a layout layer is a hierarchy of cells. In some embodiments, aspects of the cell hierarchy include: a basic layout element (BLE), which is a cell that includes no other cells; a nestor cell, which is a cell that includes one or more BLEs and/one or more nestee cells; a nestee cell is a cell which is included in a nestor cell and is itself a nestor cell such that the nestee cell includes one or more BLEs and/or one or more nestee cells. A given nestor cell can include one or more other nestor cells. A BLE that is included in a nestor cell is a nestee BLE. A BLE that is not a nestee BLE is an independent cell. A nestor cell that is not included in any other nestor cell is an independent cell. In some embodiments, each layout layer in the dissectible design package is a hierarchical collection of BLEs. In some embodiments, each BLE is represented by one or more segments.

The designer, based on the specification of the IC-based product to be manufactured, executes the steps/stages of a design procedure by which to obtain the dissectible design package. The design procedure may include, for example, logic design, physical design, and/or place-and-route. As an example, a portion of the dissectible design package includes polygons representing various features such as active regions, gate electrodes, source region/electrode, drain region/electrode, metal lines and vias of an interlayer interconnection, and/or openings for bonding pads, to be formed in and on a substrate, e.g., a semiconductor substrate (such as a silicon wafer) and various material layers disposed over the semiconductor substrate. In some embodiments, the dissectible design package includes certain assist features, such as for imaging effect, processing enhancement, and/or mask identification information.

From block 104, flow proceeds to a block 106, where an EDA tool subjects the dissectible design package to dissection. The dissection assigns dissection points to edges of the various features (polygons). In some embodiments, segments are defined by the dissection points. In some embodiments, a segment is defined as a portion of the edge of the dissected feature (polygon) which lies between two adjacent dissection points.

The result of the dissection is a design package of an IC which is ready for OPC but has not yet been subjected to OPC, namely a pre-OPC design package of an IC. In some embodiments, like the dissectible design package, the pre-OPC design package includes multiple physical layout layers, for example, where each layout layer is a cell-based representation of a layout layer.

From block 106, flow proceeds to blocks 140-152A. Blocks 140-152A generate seeds for package-scope seeding. Eventually, if the EDA tool determines that package-scope seeding is possible (as discussed below in the context of blocks 150A-150B), then flow proceeds to a block 112 inside a block 108. If eventually, however, the EDA tool determines that package-scope seeding is not possible (as discussed below in the context of a block 148A), then flow proceeds to a block 110 inside block 108. At block 108, the EDA tool subjects the pre-OPC design package to an OPC process.

More particularly, from block 148A, flow proceeds inside block 108 to a block 110, where the EDA tool subjects the pre-OPC design package to rule-based OPC and thereby creates a rule-corrected design package (DP). In some embodiments, rule-based OPC includes rules to implement certain changes to the layout layers, thereby compensating for some optical distortions. In some embodiments, to compensate for line-end shortening, rule-based OPC adds a hammerhead to a line end. In some embodiments, to compensate for corner rounding, rule-based OPC adds serif shapes to outer corners or subtracts serif shapes from inner corners. In some embodiments, each segment in the rule-corrected DP is associated with a corresponding rule-adjustment/correction value (also referred to as a rule-OPC bias). For those segments which are not adjusted during block 110, the associated rule-OPC bias value is zero. Alternatively, for some embodiments, only those segments which are adjusted during block 110 are associated with a corresponding rule-OPC bias value.

From block 110, flow stays inside block 108 and proceeds to enter a loop in which the EDA tool repeatedly (or iteratively) performs model-based OPC until a convergence criterion is satisfied. The loop includes a model-based OPC block 112 and a decision block 114. In some embodiments, during model-based OPC, a real pattern transfer (an image on the wafer produced using a given mask) is simulated/predicted with a model (which includes a set of mathematical formulas), and the edges of features in a layout layer are dissected into a plurality of segments, thereby allowing these segments to be individually moved to correct for proximity effects. In some embodiments, the placement of the dissection points is determined by the feature shape, size, and/or position relative to other features, by simulation, by exploring the proximity behavior along the edges, or by other placement-evaluation techniques.

In some embodiments, each iteration through block 112 generates an $i^{th}$ version of the DP by subjecting the previous version (namely, the $(i-1)^{th}$ version of the DP) to model-based OPC. For simplicity of terminology, the output of block 112 is referred to as a meso DP such that the $i^{th}$ iteration through block 112 generates the $i^{th}$ meso DP. In some embodiments, the EDA tool treats the rule-corrected DP as the initial meso DP, and sets the counter, i, equal to 1 (i=1) rather than zero (0). Accordingly, in effect, the EDA tool pretends that an i=0 iteration (the $0^{th}$ iteration) has already occurred and treats the rule-corrected DP as the meso DP resulting from the $0^{th}$ iteration, namely as the $0^{th}$ meso DP. Then, during the i=1 iteration through block 112, the EDA tool subjects the rule-corrected DP (the $0^{th}$ meso DP) to model-based OPC to generate a meso DP for the i=1 iteration, namely to generate a first ($1^{st}$) meso design package.

In some embodiments, for the $i^{th}$ iteration of model-based OPC (which operates on the preceding version of meso DP, namely on the $(i-1)^{th}$ meso DP), each cell in the $(i-1)^{th}$ meso DP is analyzed sequentially to determine if the $(i-1)^{th}$ meso DP should be adjusted/corrected. In some embodiments, because (1) a dissectible design package includes multiple physical layout layers, (2) each layout layer in the dissectible design package is a hierarchical collection of BLEs, and (3) each BLE is represented by one or more segments (as discussed above), for the $i^{th}$ iteration of model-based OPC, each BLE is analyzed sequentially to determine if the BLE should be adjusted/corrected. Within each BLE, each of the one or more segments is analyzed sequentially to determine if the segment should be adjusted/corrected. During each $i^{th}$ iteration, an adjustment/correction value (also referred to as a OPC-model bias) is determined not only on a cell-by-cell basis, and not only on a BLE-by-BLE basis, but on a segment-by-segment basis. In some embodiments, for the $i^{th}$ iteration of model-based OPC, each segment in the resulting $i^{th}$ meso DP is associated with a corresponding model-OPC bias value. For those segments which are not adjusted during the $i^{th}$ iteration, the associated model-OPC bias value is zero. Alternatively, for some embodiments, only those segments which are adjusted during the $i^{th}$ iteration are associated with a corresponding model-OPC bias value.

With each iteration, the quality of the resulting meso DP improves. The quality of the meso DP converges towards an acceptable level. After each iteration, the resulting meso DP is evaluated to decide whether the $i^{th}$ meso DP has converged enough. In some embodiments, flow proceeds from block 112 to decision block 114, where the EDA tool evaluates the $i^{th}$ meso DP against a convergence criterion. In some embodiments, the convergence criterion is a threshold. In some embodiments, the threshold represents an acceptable maximum level of distortion in a patterned layer which could be produced photolithographically using a mask based on the $i^{th}$ meso DP. If the outcome of decision block 114 is no (such that the $i^{th}$ meso DP has not converged enough), then the counter, i, is incremented (i=i+1) and flow proceeds to loop back to block 112. However, if the outcome of decision block 114 is yes (such that the $i^{th}$ meso DP has converged enough), then flow proceeds to a block 116.

At block 116, the EDA tool sets the $i^{th}$ meso DP as the post-OPC design package. From block 116, flow exits block 108 and proceeds to a block 118, where the EDA tool outputs the post-OPC design package.

In some embodiments, the model-based OPC of block 112 proceeds sequentially, not only on a cell-by-cell basis, and not only on a BLE-by-BLE basis, but on a segment-by-segment basis during each iteration. Each iteration of block 112 is computationally expensive (e.g., in terms of processor cycles and/or memory volume). Without seeding, typically many iterations through block 112 are needed before the $i^{th}$ meso DP has converged enough to stop iterating. As design packages become increasingly more complex, increasingly more iterations through block 112 are needed. As a consequence, a turn around time (TAT) (elapsed from the beginning to the end of the OPC process) of unseeded model-based OPC has become unacceptably large.

If, for example, cell-scope seeding was attempted during each iteration, i.e., seeding on a cell-by-cell basis (and more so on a BLE-by-BLE basis, and much more so on a segment-by-segment basis), the number of iterations through block 112 should be reduced relative to an unseeded scenario. However, cell-scope seed is hampered by the great number of cells (and more so BLEs, and much more so segments) in a typical pre-OPC design package such that cell-scope seeding suffers unacceptable TATs.

In some embodiments, the package-scope seeding of blocks 140-152A reduces the number of iterations of model-based OPC and thus reduces the TAT in comparison to cell-scope seeding. Blocks 140-152A, in effect, recognize that if there is an archived post-OPC design package (which resulted from a previously-performed OPC process) whose corresponding archived pre-OPC design-signature was sufficiently similar to a subject pre-OPC layout-layer (for which an OPC process was being contemplated), then the model-OPC bias values for the entire archived post-OPC design package can be used as seeds for the contemplated OPC process (package-scope seeding) (as if the seeds for the entire meso DP were determined in parallel rather than sequentially on a cell-by-cell basis during the initial iteration of block 112 (more accurately on a BLE-by-BLE basis, and yet more accurately on a segment-by-segment basis)), thereby jumpstarting the OPC process. In some embodiments, according to experimental data, package-scope seeding achieves a reduction in TATs of about 20%-30% in comparison to cell-scope seeding. In some embodiments, experimental data suggests that package-scope seeding can achieve a reduction in TATs of about 50% in comparison to cell-scope seeding.

In FIG. 1A, flow proceeds from block 106 to block 140, where the pre-OPC design package becomes the subject of a seeding-analysis, and hence is treated as a subject pre-OPC design package. From block 140, flow proceeds to a block 142A.

At block 142A, the EDA tool determines a subject pre-OPC design-signature for the subject pre-OPC design package. In some embodiments, a signature for a design package of an IC (design-signature) is based on a hash value generated by having applied an appropriate hashing function to the design package. In some embodiments, the signature for a design package is generated according to the signature-generation disclosed in U.S. Pat. No. 8,984,459, granted Mar. 17, 2015 (the '459 patent), the entirety of which is hereby incorporated by reference.

As noted above, the pre-OPC design package includes multiple physical layout layers, for example, where each layout layer is cell-based representation of a layout layer, and each layout layer is a hierarchical collection of BLEs. In view of the '459 patent: in some embodiments, a design-signature is determined recursively based on layer-signatures corresponding to the pre-OPC design package's layout layers, e.g., a summation of the layer-signatures; in some embodiments, each layer-signature is determined recursively based on independent-cell-signatures of the independent cells in the layout layer, e.g., a summation of the independent-cell-signatures (where, as explained above, an independent cell is a BLE that is not also a nestee BLE); in some embodiments, each independent-cell-signature is determined recursively based on BLE-signatures of the BLEs in the independent cell, e.g., a summation of the BLE-signatures.

For an X-Y orthogonal coordinate system, in view of the '459 patent, the following is true of some embodiments: BLEs are polygons, paths, poly-lines, trapezoids, circles, textboxes and/or other geometrical objects; a trace is numeric string representing a description that uniquely identifies a BLE and its location within the coordinate system; for a polygon, the trace is a numeric string formed by concatenating the X-coordinate and Y-coordinate of each vertex on the circumference of the polygon; and for a circle, the trace is a numeric string formed by concatenating the X-coordinate and Y-coordinate of the center of the circle; and a BLE signature is calculated based on the trace of the BLE.

For an X-Y orthogonal coordinate system, in view of the '459 patent, the following is true of some embodiments: a BLE signature, SIG_BLE, is calculated as product, SIG_BLE=circumference_BLE*X_coordinate_BLE_center*Y_coordinate_BLE_center*hashed_trace, where circumference_BLE is the circumference of the BLE, X_coordinate_BLE_center is the X-coordinate of the BLE's center, Y_coordinate_BLE_center is the Y-coordinate of the BLE's center, and hashed_trace is the result of having subjected the trace to a hashing function, e.g., the CRC32 checksum. For an X-Y orthogonal coordinate system, in some embodiments, SIG_BLE=circumference_BLE^2*X_coordinate_BLE_center*Y_coordinate_BLE_center*hashed_trace, where circumference_BLE^2 denotes the square of circumference_BLE, i.e., circumference_BLE*circumference_BLE. For an X-Y orthogonal coordinate system, in some embodiments, SIG_BLE=hashed_trace.

From block 142A, flow proceeds to a block 144A, where the EDA tool indexes into a database (e.g., an OPC database 300A in FIG. 3A, discussed below) using the subject pre-OPC design-signature as the index. From block 144A, flow proceeds to a decision block 146A. At decision block 146A, the EDA tool determines if any of the archived post-OPC design-signatures (which are stored/archived in the database) is related enough to the subject pre-OPC design-signature such that the corresponding archived post-OPC design packages can be regarded as candidates to supply seeds. Relatedness is discussed in the context of FIG. 2A. If the outcome of decision block 146A is no (such that none of the archived post-OPC design-signatures is related enough), then flow proceeds from decision block 146A to block 148A, where the EDA tool determines that package-scope seeding is not possible. In some embodiments, flow proceeds from block 148A to block 108, and more particularly within block 108 to block 110 (discussed above). Alternatively, in some embodiments, after block 148A, the EDA tool could then determine if layer-scope seeding (see discussion of FIG. 1A below) is possible.

However, if the outcome of decision block 146A is yes (such that there is at least one archived post-OPC design-signatures that is related enough), then flow proceeds from decision block 146A to a block 150A, where the EDA tool selects one amongst the one or more archived post-OPC design packages based on relatedness between the subject pre-OPC design-signature and the sufficiently-related archived post-OPC design-signatures, e.g., on the basis of which one amongst the one or more archived post-OPC design packages has the highest value for a figure of merit (discussed below in the context of FIG. 2A) being used to assess relatedness. In some embodiments, the EDA tool indexes into the database using the selected archived post-OPC design-signature thereby to retrieve the corresponding archived post-OPC design package as the selected post-OPC design package. From block 150A, flow proceeds to a block 152A.

In block 152A, the EDA tool determines one or more seeds for the OPC process based on the selected post-OPC design package. In some embodiments (for each post-OPC layout-layer of the selected archived post-OPC design package AND for each BLE in each post-OPC layout-layer AND for each of the one or more segments in the BLE), the EDA tool sets the model-OPC bias value for each of the one or more segments in the BLE as corresponding one or more seeds for the model-based OPC; such seeding is referred to herein as package-scope seeding. From block 152A, flow proceeds block 108. In some embodiments, flow proceeds within block 108 to block 112 (discussed above), bypassing block 110 (discussed above). In some embodiments, the package-scope seeding of block 152A reduces the number of iterations of model-based OPC, and thus reduces the TAT associated with model-based OPC. From block 112, flow proceeds as described above.

Figure 1B:
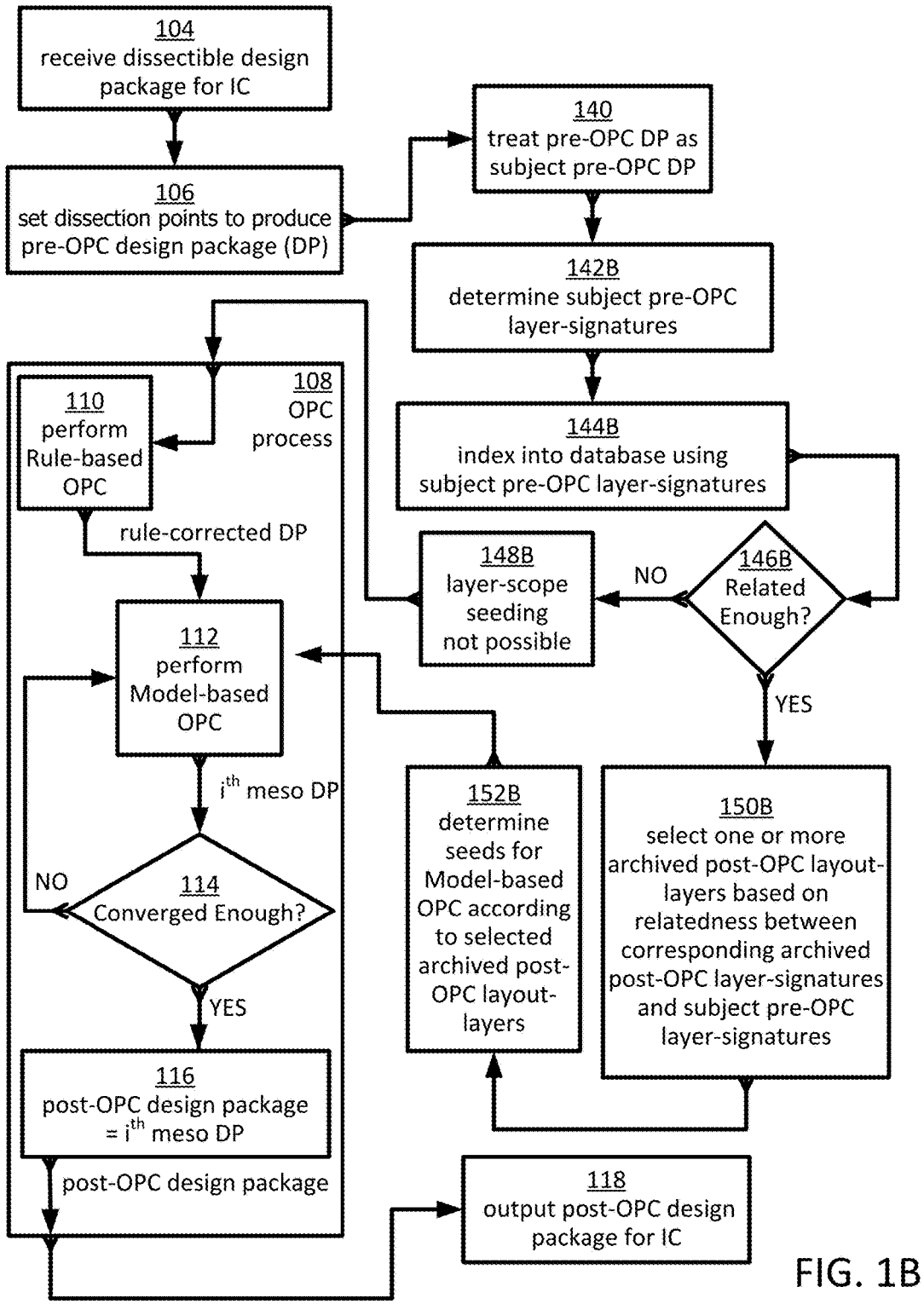
FIG. 1B is a flowchart of another method of seeding an OPC process in accordance with at least one embodiment of the present disclosure.

FIG. 1B is a flowchart of another method of seeding an optical proximity correction (OPC) process in accordance with at least one embodiment of the present disclosure.

In general, FIG. 1B (discussed below) relates to layer-scope seeding (discussed below), whereas FIG. 1A relates to package-scope seeding (discussed above). For the sake of brevity, blocks in FIG. 1B that are common to FIG. 1A will not be described again. While similar, some other blocks in FIG. 1B are different than the corresponding blocks in FIG. 1A, namely blocks 142B, 144B, 146B, 148B, 150B and 152B of FIG. 1B are similar to (and yet different from) corresponding blocks 142A, 144A, 146A, 148A, 150A and 152A of FIG. 1A, and accordingly will be discussed in less detail. In some embodiments, the method of FIG. 1B is implemented as a software application comprising computer program code for execution by a processor that is used by an EDA tool.

In FIG. 1B, in some embodiments, flow proceeds through blocks 104, 106 and 140 to a block 142B. At block 142B, the EDA tool determines subject pre-OPC layer-signatures for corresponding subject pre-OPC layout-layers. The determination of a layer-signature for a layout-layer has been discussed above. From block 142B, flow proceeds to a block 144B, where the EDA tool indexes into a database (e.g., an OPC database 300B in FIG. 3B, discussed below) using the subject pre-OPC layer-signatures as the indices. From block 144B, flow proceeds to a decision block 146B. At decision block 146B, the EDA tool determines if any of the archived post-OPC layer-signatures are related enough to the subject pre-OPC layer-signatures such that the corresponding archived post-OPC layout-layers can be regarded as candidates to supply seeds. Relatedness is discussed in the context of FIG. 2B (see below). If the outcome of decision block 146B is no (such that none of the archived post-OPC layer-signatures are is related enough), then flow proceeds from decision block 146B to a block 148B, where the EDA tool determines that layer-scope seeding is not possible. In some embodiments, flow proceeds from block 148B to block 108, and more particularly within block 108 to block 110, as in FIG. 1A.

However, if the outcome of decision block 146B is yes (such that there is at least one archived post-OPC layer-signatures that is related enough), then flow proceeds from decision block 146B to a block 150B, where the EDA tool selects one or more amongst the archived post-OPC layer-signatures based on relatedness between the subject pre-OPC layer-signatures and the sufficiently-related archived post-OPC layer-signatures, e.g., on an $i^{th}$ pre-OPC layer-signature basis as to which one amongst the one or more archived post-OPC layer-signatures has the highest value for a figure of merit (discussed below in the context of FIG. 2B) being used to assess relatedness. In some embodiments, the EDA tool indexes into the database using the one or more selected archived post-OPC layer-signatures thereby to retrieve the one or more corresponding archived post-OPC layout-layers as the one or more selected post-OPC layout-layers. From block 150B, flow proceeds to a block 152B.

In block 152B, the EDA tool determines one or more seeds for the OPC process based on the one or more selected post-OPC layout-layers. In some embodiments (for each BLE in each post-OPC layout-layer of the selected archived post-OPC design package AND for each of the one or more segments in the BLE), the EDA tool sets one or more model-OPC bias values as corresponding one or more seeds for the model-based OPC; wherein such seeding is referred to herein as layer-scope seeding. From block 152B, flow proceeds block 108, and more particularly within block 108 to block 112, bypassing block 110, as in FIG. 1A (discussed above). In some embodiments, the layer-scope seeding of block 152B significantly (if not substantially) reduces the number of iterations of model-based OPC, and thus reduces the TAT associated with model-based OPC.

Figure 2A:
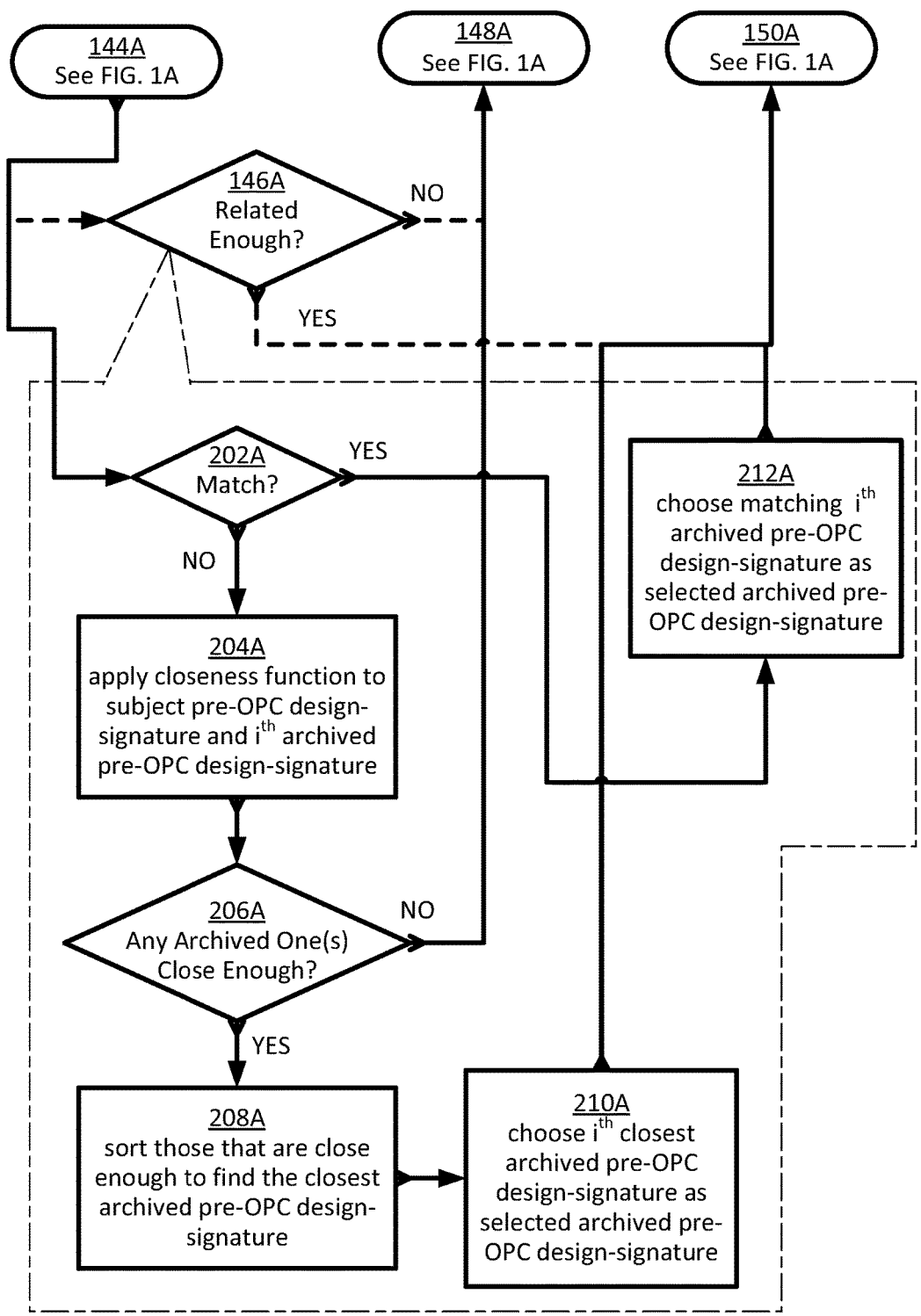
FIG. 2A is a flowchart of a method of determining relatedness of design-signatures in accordance with at least one embodiment of the present disclosure.

FIG. 2A is a flowchart of method of determining relatedness of design-signatures in accordance with at least one embodiment of the present disclosure.

In some embodiments, FIG. 2A is an example of how to implement decision block 146A of FIG. 1A (discussed above). As such, FIG. 2A relates to package-scope seeding (discussed above). By contrast, FIG. 2B (discussed below) relates to layer-scope seeding (see, e.g., FIG. 1B, discussed above). In some embodiments, the method of FIG. 2A is implemented as a software application comprising computer program code for execution by a processor that is used by an EDA tool.

In FIG. 2A, flow continues from block 144A of FIG. 1 into decision block 146A, and more particularly within decision block 146A to a block 202A, where the EDA tool makes comparisons between the subject pre-OPC design-signature and the archived post-OPC design-signatures, e.g., by iteratively comparing the subject pre-OPC design-signature and an $i^{th}$ one of the archived post-OPC design-signatures. In some embodiments, the EDA tool looks for an identical match between the subject pre-OPC design-signature and one of the archived post-OPC design-signatures. In some embodiments, a design-signature is an alphanumeric string or a numeric string. In some embodiments, a match is determined on the basis of a string match between the string representing the subject pre-OPC design-signature and the string representing one of the archived post-OPC design-signatures.

If the outcome of decision block 202A is no (such that there is no match between the subject pre-OPC design-signature and one of the archived post-OPC design-signatures), then flow proceeds from decision block 202A to a block 204A, where the EDA tool evaluates relatedness between the subject pre-OPC design-signature and each of the archived post-OPC design packages, e.g., on the basis of which one of the archived post-OPC design packages has the highest value for a figure of merit being used to assess relatedness. In some embodiments, the figure of merit is a closeness function, e.g., a string metric.

Again, in some embodiments, a design-signature is an alphanumeric string, e.g., a numeric string. A string metric provides a number indicating a type of distance (string-distance) between strings, where the string-distance has meaning relative to the algorithm used to determine the algorithm-specific indication of string-distance. In some embodiments, examples of string metrics include the Levenshtein distance (which returns a number equivalent to the number of operations needed to transform a first string into a second string, where an operation is defined as a deletion or a substitution of a single character), the Damerau-Levenshtein distance (which returns a number equivalent to the number of operations needed to transform a first string into a second string, where an operation is defined as an insertion, deletion, substitution of a single character or a transposition of two adjacent characters), the Hamming distance (which returns a number equivalent to the minimum number of substitutions required to change a first string into a second string), and other similar string metrics.

From block 204A, flow proceeds to a decision block 206A, where the EDA tool determines if any of the archived post-OPC design-signatures is close enough to the subject pre-OPC design-signature for the seeding process to continue. In some embodiments, the EDA tool compares the string-distances between the subject pre-OPC design-signature and the archived post-OPC design-signatures against a threshold. In some embodiments, the threshold is a maximum permissible distance. In some embodiments, the EDA tool iteratively compares the string-distance between subject pre-OPC design-signature and an $i^{th}$ one of the archived post-OPC design-signatures against the threshold. If the outcome of decision block 206A is no (such that no string-distance between subject pre-OPC design-signature and an $i^{th}$ one of the archived post-OPC design-signatures satisfies the threshold, e.g., is less than or equal to the threshold), then flow proceeds from decision block 206A, exiting decision block 146A and proceeding to block 148A (discussed above). Alternatively, some embodiments might arrange the flow so that blocks 204A and 206A represent an iterative loop in which an $i^{th}$ string-distance between the subject pre-OPC design-signature and an $i^{th}$ one of the archived post-OPC design-signatures is determined in block 204A and then the $i^{th}$ string-distance is compared against the threshold in decision block 206A, with the loop being iterated for all of the archived post-OPC design-signatures until a point at which flow would proceed either to block 208A (discussed below) or to block 148A.

However, if the outcome of decision block 206A is yes (such that there is at least one string-distance between subject pre-OPC design-signature and an $i^{th}$ one of the archived post-OPC design-signatures which satisfies the threshold, e.g., is less than or equal to the threshold), then flow proceeds to a block 208A, where the EDA tool sorts the string-distances to find a shortest one thereof. From block 208A, flow proceeds to a block 210A, where the EDA tool chooses the $i^{th}$ one of the archived post-OPC design-signatures which is closest to the subject pre-OPC design-signature. In some embodiments, the EDA tool chooses the $i^{th}$ one of the archived post-OPC design-signatures whose string-distance to the subject pre-OPC design-signature is smallest. From block 210A, flow exits decision block 146A and proceeds to block 150A (discussed above). In particular, in block 150A, the EDA tool selects the archived post-OPC design package corresponding to the archived post-OPC design-signature chosen in block 210A.

Returning to decision block 202A, if the outcome of decision block 202A is yes (such that there is a match between the subject pre-OPC design-signature and one of the archived post-OPC design-signatures), then flow proceeds from decision block 202A to a block 212A, where the EDA tool chooses the matching $i^{th}$ one of the archived post-OPC design-signatures to be the selected one of the archived post-OPC design-signatures. From block 212A, flow proceeds to exit decision block 146A and continues to block 150A of FIG. 1 (discussed above). In some embodiments, there will be only one of the archived post-OPC design-signatures that will be a match. Accordingly, in some embodiments, as soon as a match is found in decision block 202A, flow proceeds to block 212A. Alternatively, in case there are two or more of the archived post-OPC design-signatures that will be a match, in some embodiments, the EDA tool continues making comparisons until all of the archived post-OPC design-signatures have been compared against the subject pre-OPC design-signature. In such embodiments, if more than one match is found, for example, then the EDA tool selects one amongst the two or more matching archived post-OPC design packages based on relatedness between the subject pre-OPC design-signature and each of the two or more matching archived post-OPC design packages, e.g., on the basis of which one of the two or more matching archived post-OPC design packages has the highest value for a figure of merit being used to assess relatedness. Such relatedness has been discussed above.

Figure 2B:
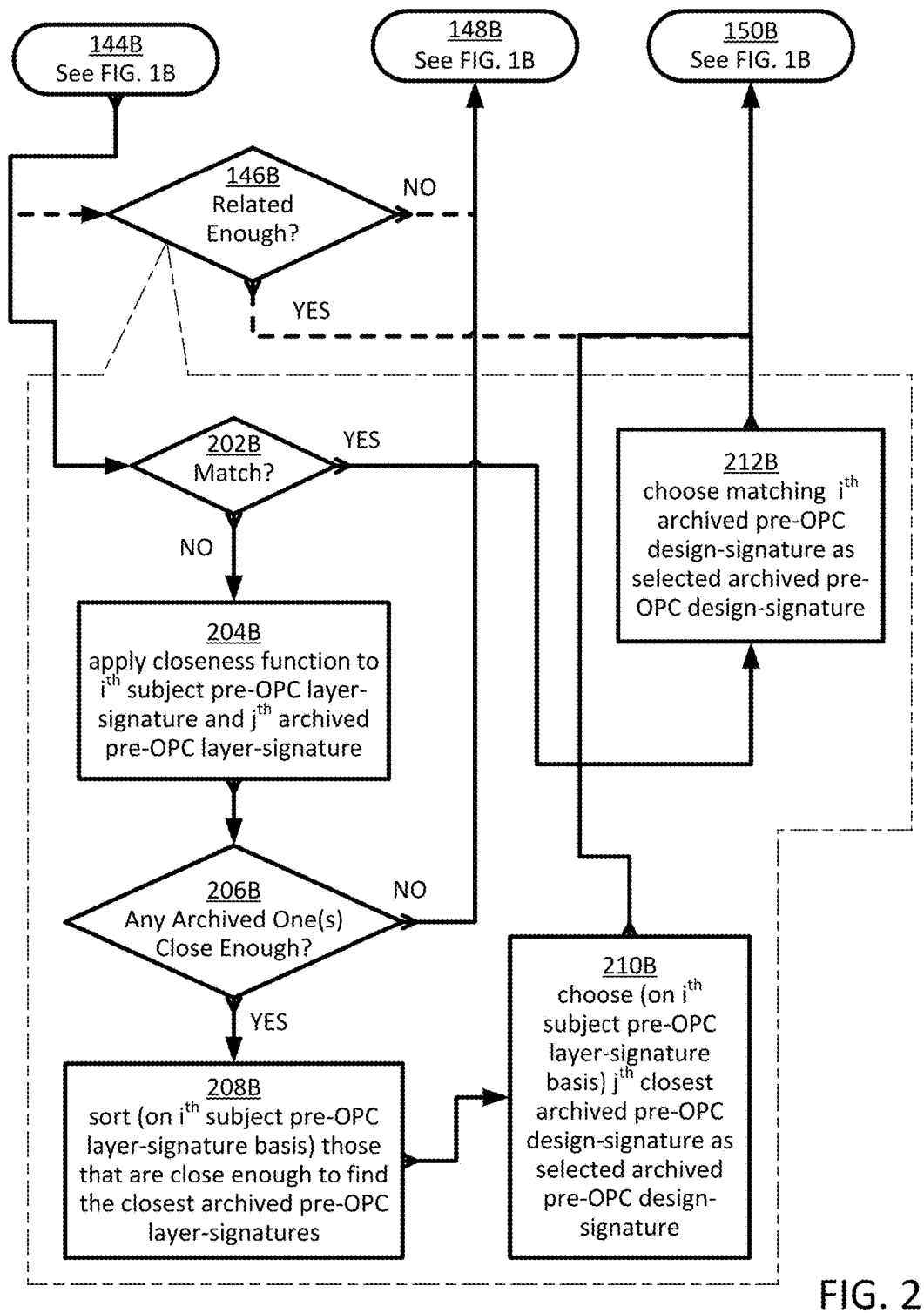
FIG. 2B is a flowchart of a method of determining relatedness of layer-signatures in accordance with at least one embodiment of the present disclosure.

FIG. 2B is a flowchart of method of determining relatedness of layer-signatures in accordance with at least one embodiment of the present disclosure.

In some embodiments, FIG. 2B is an example of how to implement decision block 146A. As such, FIG. 2B relates to layer-scope seeding (discussed above). By contrast, FIG. 2A relates to package-scope seeding (see, e.g., FIG. 1A, discussed above). In some embodiments, the method of FIG. 2B is implemented as a software application comprising computer program code for execution by a processor that is used by an EDA tool.

In FIG. 2B, flow continues from block 144A of FIG. 1 into decision block 146A, and more particularly within decision block 146A to a block 202B, where the EDA tool makes comparisons between the subject pre-OPC layer-signatures and the archived post-OPC layer-signatures, e.g., by iteratively comparing (on an $i^{th}$ subject pre-OPC layer-signature basis) the $i^{th}$ subject pre-OPC layer-signature and a $i^{th}$ one of the archived post-OPC layer-signatures. In some embodiments, the EDA tool looks for an identical match between the $i^{th}$ subject pre-OPC layer-signature and one of the archived post-OPC layer-signatures. In some embodiments, a layer-signature is an alphanumeric string or a numeric string. In some embodiments, a match is determined on the basis of a string match between the string representing the $i^{th}$ subject pre-OPC layer-signature and the string representing one of the archived post-OPC layer-signatures.

If the outcome of decision block 202B is no (such that there is no match between any of the subject pre-OPC layer-signatures and the archived post-OPC layer-signatures), then flow proceeds from decision block 202B to a block 204B, where the EDA tool evaluates relatedness (on an $i^{th}$ subject pre-OPC layer-signature basis) between the $i^{th}$ subject pre-OPC layer-signature and each of the archived post-OPC layer-signatures, e.g., on the basis of which one of the archived post-OPC layer-signatures has the highest value for a figure of merit being used to assess relatedness. In some embodiments, the figure of merit is a closeness function, e.g., a string metric, as discussed above. Again, in some embodiments, a layer-signature is an alphanumeric string, e.g., a numeric string.

From block 204B, flow proceeds to a decision block 206B, where the EDA tool determines if any of the archived post-OPC layer-signatures is close enough to the $i^{th}$ subject pre-OPC layer-signature for the seeding process to continue. In some embodiments, the EDA tool compares the string-distances between the $i^{th}$ subject pre-OPC layer-signature and the archived post-OPC layer-signatures against a threshold. In some embodiments, the threshold is a maximum permissible distance. In some embodiments, the EDA tool iteratively compares the string-distance between $i^{th}$ subject pre-OPC layer-signature and a $i^{th}$ one of the archived post-OPC layer-signatures against the threshold. If the outcome of decision block 206B is no (such that no string-distance between the $i^{th}$ subject pre-OPC layer-signature and the $i^{th}$ one of the archived post-OPC layer-signatures satisfies the threshold, e.g., is less than or equal to the threshold), then flow proceeds from decision block 206B, exiting decision block 146B and proceeding to block 148B (discussed above). Alternatively, some embodiments might arrange the flow so that blocks 204B and 206B represent an iterative loop in which an $i^{th}$ string-distance between the $i^{th}$ subject pre-OPC layer-signature and the $j^{th}$ one of the archived post-OPC layer-signatures is determined in block 204B and then the $i^{th}$ string-distance is compared against the threshold in decision block 206B, with the loop being iterated for all of the subject pre-OPC layer-signatures and all of the post-OPC layer-signatures until a point at which flow would proceed either to block 208B (discussed below) or to block 148B.

However, if the outcome of decision block 206B is yes (such that there is at least one string-distance between the $i^{th}$ subject pre-OPC layer-signature and the $i^{th}$ one of the archived post-OPC layer-signatures which satisfies the threshold, e.g., is less than or equal to the threshold), then flow proceeds to a block 208B, where the EDA tool sorts (on an $i^{th}$ subject pre-OPC layer-signature basis) the string-distances to find a shortest one thereof for each $i^{th}$ subject pre-OPC layer-signature. From block 208B, flow proceeds to a block 210B, where the EDA tool chooses (on an $i^{th}$ subject pre-OPC layer-signature basis) the $i^{th}$ one of the archived post-OPC layer-signatures which is closest to the $i^{th}$ subject pre-OPC layer-signature. In some embodiments, the EDA tool chooses the $i^{th}$ one of the archived post-OPC layer-signatures whose string-distance to the $i^{th}$ subject pre-OPC layer-signature is smallest. From block 210B, flow exits decision block 146A and proceeds to block 150B of FIG. 1B (discussed above). In particular, in block 150B, the EDA tool selects the one or more archived post-OPC layout-layers corresponding to one or more the archived post-OPC layer-signatures chosen in block 210B.

Returning to decision block 202B, if the outcome of decision block 202B is yes (such that there is a match between any of the subject pre-OPC layer-signatures and the archived post-OPC layer-signatures), then flow proceeds from decision block 202B to a block 212B, where the EDA tool chooses (on an $i^{th}$ subject pre-OPC layer-signature basis) the matching $j^{th}$ one of the archived post-OPC layer-signatures to be the one or more selected archived post-OPC layer-signatures. From block 212B, flow proceeds to exit decision block 146B and continues to block 150B of FIG. 1B (discussed above). In some embodiments, there will be only one of the archived post-OPC layer-signatures that will be a match to the $i^{th}$ subject pre-OPC layer-signature. Accordingly, in some embodiments, as soon as a match is found in decision block 202B, flow proceeds to block 212B. Alternatively, in case there are two or more of the archived post-OPC layer-signatures that will be a match to the $i^{th}$ subject pre-OPC layer-signature, in some embodiments, the EDA tool continues making comparisons until all of the archived post-OPC layer-signatures have been compared against the $i^{th}$ subject pre-OPC layer-signature. In such embodiments, if more than one match is found, for example, then the EDA tool selects one amongst the two or more matching archived post-OPC layer-signatures based on relatedness between the $i^{th}$ subject pre-OPC layer-signature and each of the two or more matching archived post-OPC layer-signatures, e.g., on the basis of which one of the two or more matching archived post-OPC layer-signatures has the highest value for a figure of merit being used to assess relatedness. Again, such relatedness has been discussed above.

Figure 3A:
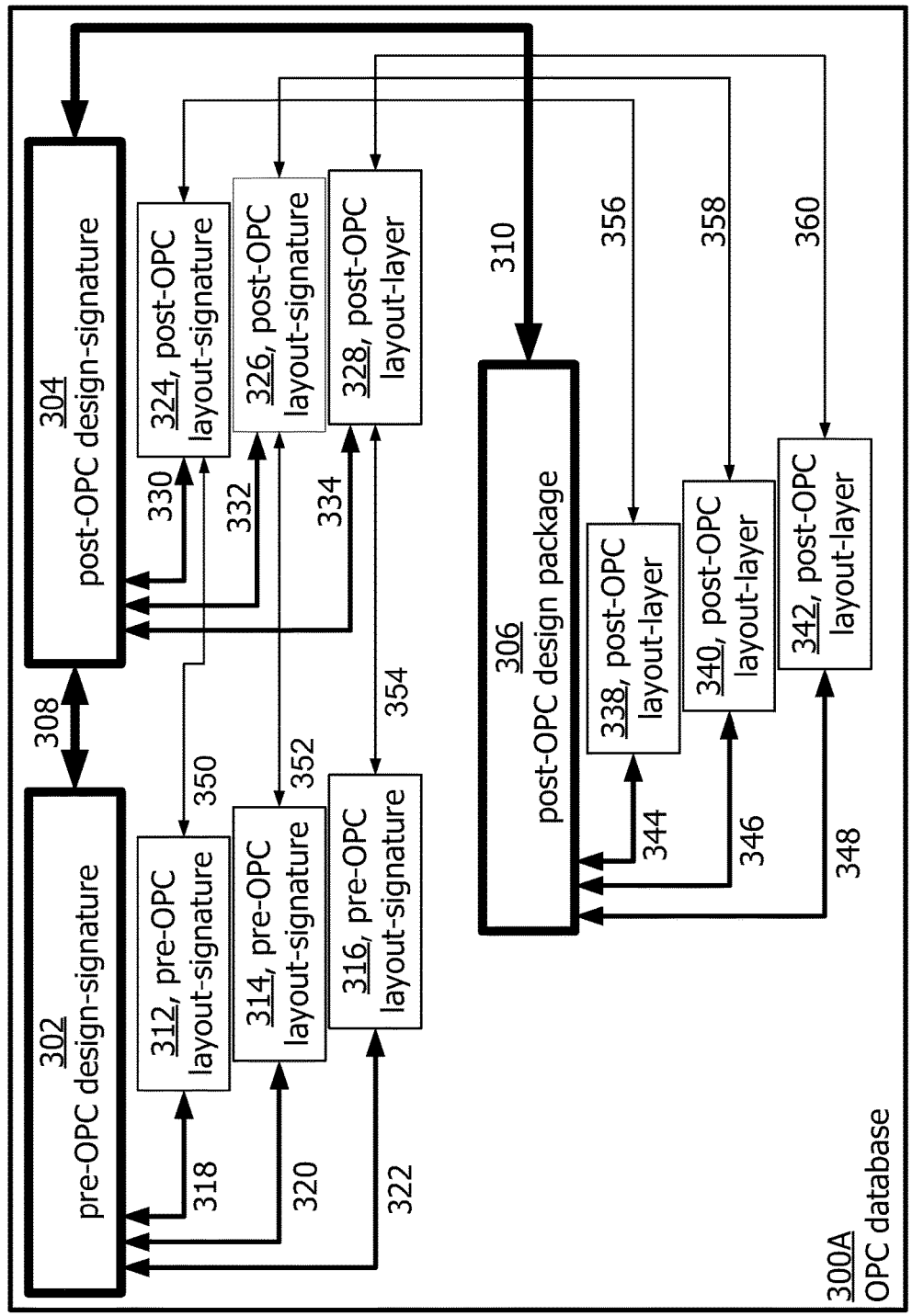
FIG. 3A is a block diagram of a database and data structures therein in accordance with at least one embodiment of the present disclosure.

FIG. 3A is a block diagram of a database, e.g., an OPC database 300A, and data structures therein in accordance with at least one embodiment of the present disclosure.

Database 300A can serve, e.g., as the database mentioned in FIG. 1A. As such, database 300A relates to package-scope seeding (discussed above). By contrast, database 300B (discussed below) relates to layer-scope seeding (see, e.g., FIG. 1B, discussed above). In some embodiments, elements included in OPC database 300A are labeled with the adjective, archived, e.g., because their inclusion in OPC database 300A is for archival purposes. In some embodiments, pre-OPC design-signature 302 is labeled with the adjective, archived, e.g., to help distinguish pre-OPC design-signature 302 from the subject pre-OPC design-signature, e.g., mentioned above in the context of FIG. 1A.

In FIG. 3A, OPC database 300A includes: a pre-OPC design-signature 302; a corresponding post-OPC design-signature 304; and a corresponding post-OPC design package 306. OPC database 300A further includes: a data structure 308 linking (or mapping) pre-OPC design-signature 302 and post-OPC design-signature 304; and a data structure 310 linking post-OPC design-signature 304 and post-OPC design package 306. In the example OPC database 300A of FIG. 3A, the pre-OPC design package to which pre-OPC design-signature 302 corresponds is not included, e.g., as a way to reduce memory consumption. Alternatively, in some embodiments, OPC database 300A does include the pre-OPC design package to which pre-OPC design-signature 302 corresponds.

While not including the pre-OPC design package to which pre-OPC design-signature 302 corresponds (as discussed above) nor the multiple physical pre-OPC layout-layers included therein, OPC database 300A of FIG. 3 does include multiple pre-OPC layer-signatures corresponding to the multiple physical pre-OPC layout-layers. For simplicity of illustration, the pre-OPC design package (to which pre-OPC design-signature 302 corresponds) is assumed to have three pre-OPC layout-layers such that FIG. 3 includes only pre-OPC layer-signatures 312, 314 and 316. Of course, other pre-OPC design packages having different numbers of pre-OPC layout-layers are contemplated. OPC database 300A further includes: a data structure 318 linking pre-OPC design-signature 302 and corresponding pre-OPC layer-signature 312; a data structure 320 linking pre-OPC design-signature 302 and corresponding pre-OPC layer-signature 314; and a data structure 322 linking pre-OPC design-signature 302 and corresponding pre-OPC layer-signature 316.

Like the pre-OPC design package, post-OPC design package 306 includes multiple physical post-OPC layout-layers, for example, where each post-OPC layout-layer is a cell-based representation of a layout layer. In some embodiments, like the pre-OPC design package, post-OPC design package 306 is a dissectible design package that includes multiple physical post-OPC layout-layers, with each post-OPC layout-layer being a hierarchical collection of BLEs, each BLE being represented by one or more segments (as discussed above), and each segment being associated with a corresponding model-OPC bias value. Continuing the assumption of three pre-OPC layout-layers (again, for simplicity of illustration), post-OPC design package 306 of OPC database 300A further includes: a corresponding post-OPC layout-layer 338; a corresponding post-OPC layout-layer 340; and a corresponding post-OPC layout-layer 340. Also, OPC database 300A further includes: a data structure 344 linking post-OPC design package 306 and post-OPC layout-layer 338; a data structure 346 linking post-OPC design package 306 and post-OPC layout-layer 340; and a data structure 348 linking post-OPC design package 306 and post-OPC layout-layer 342.

Continuing further the assumption of three pre-OPC layout-layers (again, for simplicity of illustration), OPC database 300A further includes: a corresponding post-OPC layer-signature 324; a corresponding post-OPC layer-signature 326; a corresponding post-OPC layer-signature 328; a data structure 330 linking post-OPC design-signature 304 and post-OPC layer-signature 324; a data structure 332 linking post-OPC design-signature 304 and post-OPC layer-signature 326; and a data structure 334 linking post-OPC design-signature 304 and post-OPC layer-signature 328.

OPC database 300A further includes: a data structure 350 linking pre-OPC layer-signature 312 and corresponding post-OPC layer-signature 324; a data structure 352 linking pre-OPC layer-signature 314 and corresponding post-OPC layer-signature 326; and a data structure 354 linking pre-OPC layer-signature 316 and corresponding post-OPC layer-signature 328.

OPC database 300A yet further includes: a data structure 356 linking post-OPC layout-layer 338 and corresponding post-OPC layer-signature 324; a data structure 358 linking post-OPC layout-layer 340 and corresponding post-OPC layer-signature 326; and a data structure 360 linking post-OPC layout-layer 342 and corresponding post-OPC layer-signature 328.

As noted, post-OPC design package 306, post-OPC layout-layer 338, post-OPC layout-layer 340, post-OPC layout-layer 342, data structure 344, data structure 346 and data structure 348 are stored in OPC database 300A. Alternatively, in some embodiments, post-OPC design package 306, post-OPC layout-layer 338, post-OPC layout-layer 340, post-OPC layout-layer 342, data structure 344, data structure 346 and data structure 348 are not stored in OPC database 300A but instead in another database.

Figure 3B:
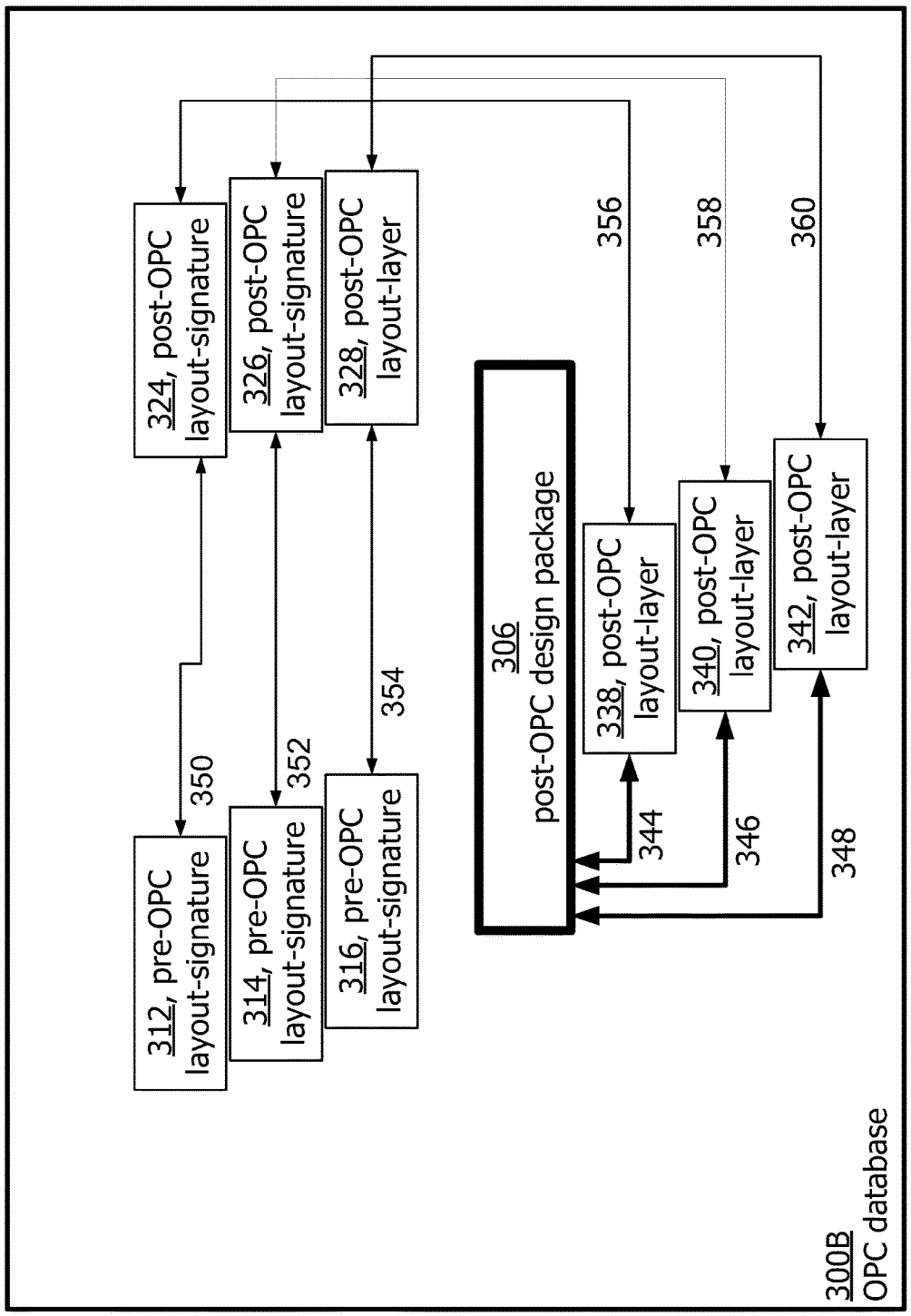
FIG. 3B is a block diagram of another database and data structures therein in accordance with at least one embodiment of the present disclosure.

FIG. 3B is a block diagram of another database, e.g., an OPC database 300B, and data structures therein in accordance with at least one embodiment of the present disclosure. OPC database 300B is a simplified version of OPC database 300A.

Database 300B can serve, e.g., as the database mentioned in FIG. 1B (discussed above). As such, database 300B (discussed below) relates to layer-scope seeding (see, e.g., FIG. 1B, discussed above). By contrast, database 300A relates to package-scope seeding (discussed above). In some embodiments, elements included in OPC database 300B are labeled with the adjective, archived, e.g., because their inclusion in OPC database 300B is for archival purposes. In some embodiments, pre-OPC layer-signature 312, pre-OPC layer-signature 314 pre-OPC layer-signature 316 are labeled with the adjective, archived, e.g., to help distinguish pre-OPC layer-signature 312, pre-OPC layer-signature 314 pre-OPC layer-signature 316 from the subject pre-OPC layer-signature, e.g., mentioned above in the context of FIG. 1B.

In some embodiments, database 300B has elements common to database 300A (discussed above). For the sake of brevity, elements in database 300B that are common to database 300A will not be described again. In some embodiments, database 300B differs from database 300A by not including some of the elements included in database 300A, e.g., as a way to reduce memory consumption. Elements of database 300A not found in database 300B include, e.g.: pre-OPC design-signature 302; post-OPC design-signature 304; data structure 308; data structure 310; data structure 318; data structure 320; data structure 322; data structure 330; and data structure 332. In some embodiments, elements of database 300A not found in database 300B are stored in another database.

As noted, post-OPC design package 306, post-OPC layout-layer 338, post-OPC layout-layer 340, post-OPC layout-layer 342, data structure 344, data structure 346 and data structure 348 are stored in OPC database 300B. Alternatively, in some embodiments, post-OPC design package 306, post-OPC layout-layer 338, post-OPC layout-layer 340, post-OPC layout-layer 342, data structure 344, data structure 346 and data structure 348 are not stored in OPC database 300B but instead in another database.

Figure 4A:
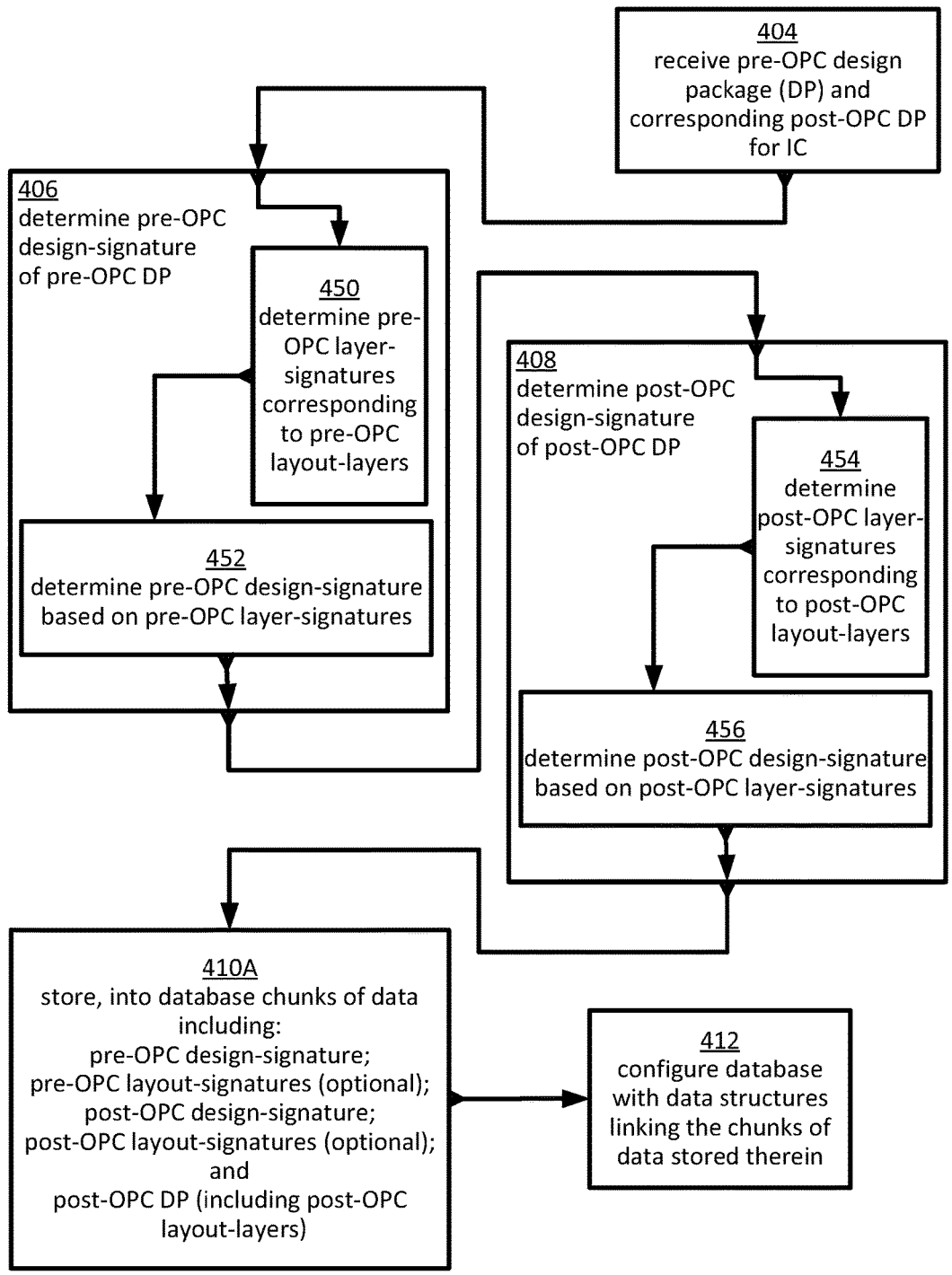
FIG. 4A is a flowchart of a method of populating an OPC database in accordance with at least one embodiment of the present disclosure.

FIG. 4A is a flowchart of method of populating an optical proximity correction (OPC) database in accordance with at least one embodiment of the present disclosure.

In general, FIG. 4A relates to package-scope seeding (see, e.g., FIG. 1A, discussed above). By contrast, FIG. 4B relates to layer-scope seeding (see, e.g., FIG. 1B, discussed above). In some embodiments, the method of FIG. 4A is implemented as a software application comprising computer program code for execution by a processor that is used by an EDA tool.

In FIG. 4A, in some embodiments, an input device of the EDA tool receives a pre-OPC design package of an integrated circuit (IC) and a corresponding post-OPC design package at a block 404. Again, in some embodiments, the pre-OPC design package includes at least one cell-based representation of a pre-OPC layout-layer; and the corresponding post-OPC design package includes at least one cell-based representation of a post-OPC layout-layer. Alternatively, in some embodiments, block 404 could be implemented as two separate reception blocks, e.g., with the pre-OPC design package being received first and the corresponding post-OPC design package being received second, or vice-versa. From block 404, flow proceeds to a block 406.

At block 406, the EDA tool determines a pre-OPC design-signature for the pre-OPC design package, e.g., as discussed above. From block 406, in some embodiments, flow proceeds to a block 408. In some embodiments, flow proceeds within block 406 to a block 450, where the EDA tool determines, for each of the at least one pre-OPC layout-layer included in the pre-OPC design package, a pre-OPC layer-signature, e.g., as discussed above. From block 450, flow proceeds to a block 452, where the EDA tool determines the pre-OPC design-signature based on the at least one pre-OPC layer-signature, e.g., as discussed above. From block 452, flow proceeds to exit block 406 and proceed to block 408.

At block 408, the EDA tool determines, a post-OPC design-signature for the post-OPC design package, e.g., as discussed above. In some embodiments, flow proceeds to a block 410A. In some embodiments, flow proceeds within block 408 to a block 454, where the EDA tool determines, for each of the at least one post-OPC layout-layer, a post-OPC layer-signature, e.g., as discussed above. From block 454, flow proceeds to a block 456, where the EDA tool determines the post-OPC design-signature based on the at least one post-OPC layer-signature, e.g., as discussed above. From block 456, flow proceeds to exit block 408 and proceed to block 410A.

At block 410A, the EDA tool stores (into an OPC database, such as OPC database 300A of FIG. 3A, operatively connected to the EDA tool) at least: the pre-OPC design-signature; the post-OPC design-signature; and the post-OPC design package (including the at least one cell-based representation of a post-OPC layout-layer). In some embodiments, the EDA tool also stores into the OPC database: the at least one pre-OPC layer-signature corresponding to the at least one pre-OPC layout-layer included in the pre-OPC design package, and/or the at least one post-OPC layer-signature corresponding to the at least one cell-based representation of a post-OPC layout-layer in the post-OPC design package.

From block 410A, flow proceeds to a block 412, where the EDA tool configures the OPC database, e.g., by storing (into the OPC database) at least: a data structure linking the pre-OPC design-signature and the post-OPC design-signature; and a data structure linking the post-OPC design-signature and the post-OPC design package. In some embodiments, the EDA tool further configures the OPC database, e.g., by storing/appending (into the OPC database) at least: at least one data structure linking the pre-OPC design-signature and the corresponding at least one pre-OPC layer-signature; at least one data structure linking the post-OPC design-signature and the corresponding at least one post-OPC layer-signature; and at least one data structure linking the at least one pre-OPC layer-signature and the corresponding at least one post-OPC layer-signature. Again, in some embodiments, post-OPC design package 306, post-OPC layout-layer 338, post-OPC layout-layer 340, post-OPC layout-layer 342, data structure 344, data structure 346 and data structure 348 are not stored in OPC database 300A but instead in another database.

Figure 4B:
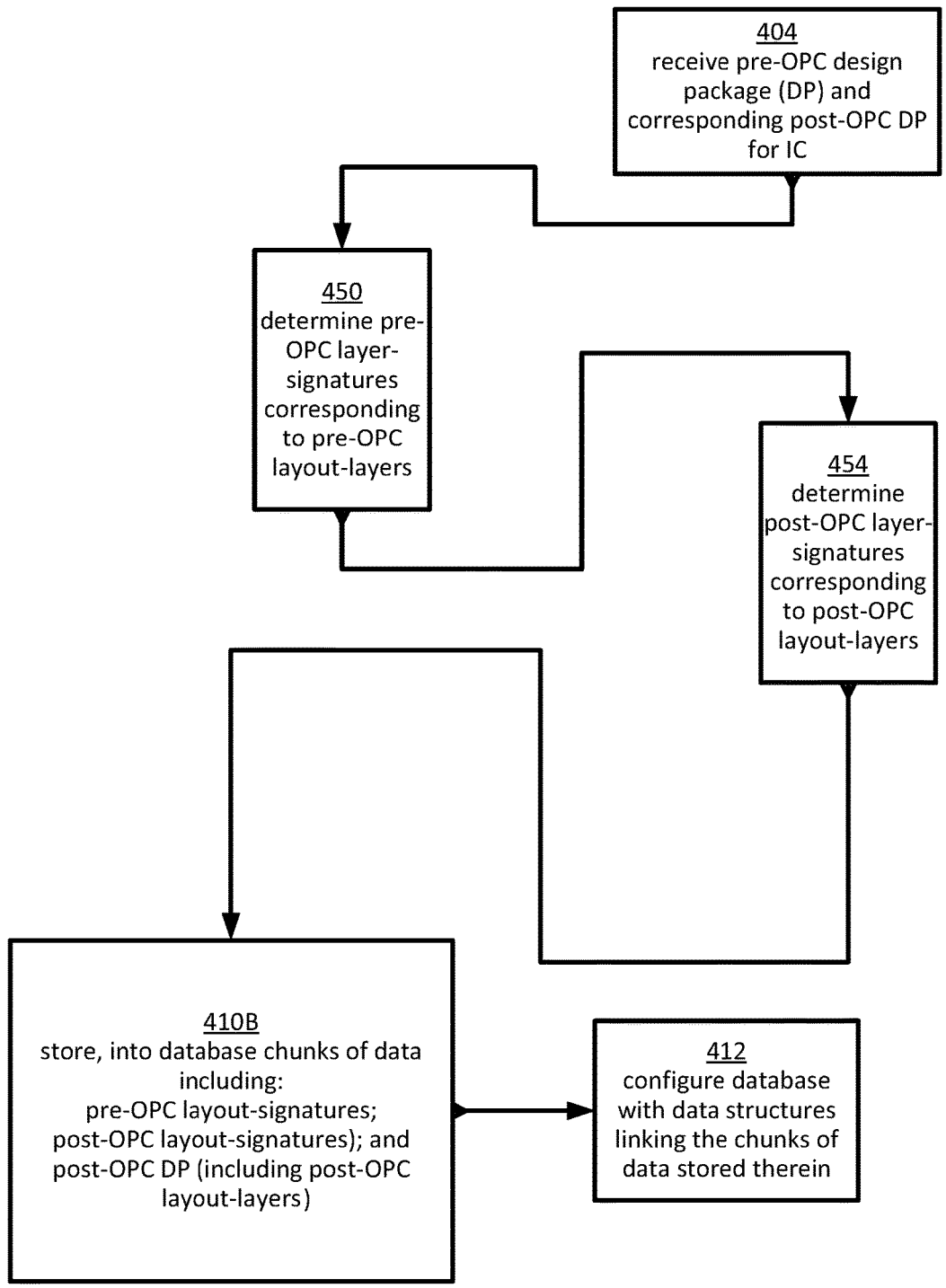
FIG. 4B is a flowchart of another method of populating an OPC database in accordance with at least one embodiment of the present disclosure.

FIG. 4B is a flowchart of another method of populating an optical proximity correction (OPC) database in accordance with at least one embodiment of the present disclosure.

FIG. 4B relates to layer-scope seeding (see, e.g., FIG. 1B, discussed above). By contrast, FIG. 4A relates to package-scope seeding (see, e.g., FIG. 1A, discussed above). For the sake of brevity, blocks in FIG. 4B that are common to FIG. 4A will not be described again. While similar, block 410B of FIG. 4B is different than corresponding block 410A in FIG. 4A, and accordingly will be discussed in less detail. In some embodiments, the method of FIG. 4B is implemented as a software application comprising computer program code for execution by a processor that is used by an EDA tool.

In FIG. 4B, flow proceeds from block 404 to block 450, where the EDA tool determines, for each of the at least one pre-OPC layout-layer included in the pre-OPC design package, a pre-OPC layer-signature, e.g., as discussed above. From block 450, flow proceeds to block 454, where the EDA tool determines, for each of the at least one post-OPC layout-layer, a post-OPC layer-signature, e.g., as discussed above. From block 454, flow proceeds to a block 410B.

At block 410B, in some embodiments, the EDA tool stores (into an OPC database, such as OPC database 300B of FIG. 3B, operatively connected to the EDA tool) at least: the at least one cell-based representation of a post-OPC layout-layer of the post-OPC design package; the at least one pre-OPC layer-signature corresponding to the at least one post-OPC layer-signature; and the at least one post-OPC layer-signature corresponding to the at least one post-OPC layout-layer in the post-OPC design package. From block 410B, flow proceeds to a block 412 (as described above). Again, in some embodiments, post-OPC design package 306, post-OPC layout-layer 338, post-OPC layout-layer 340, post-OPC layout-layer 342, data structure 344, data structure 346 and data structure 348 are not stored in OPC database 300B but instead in another database.

Figure 5:
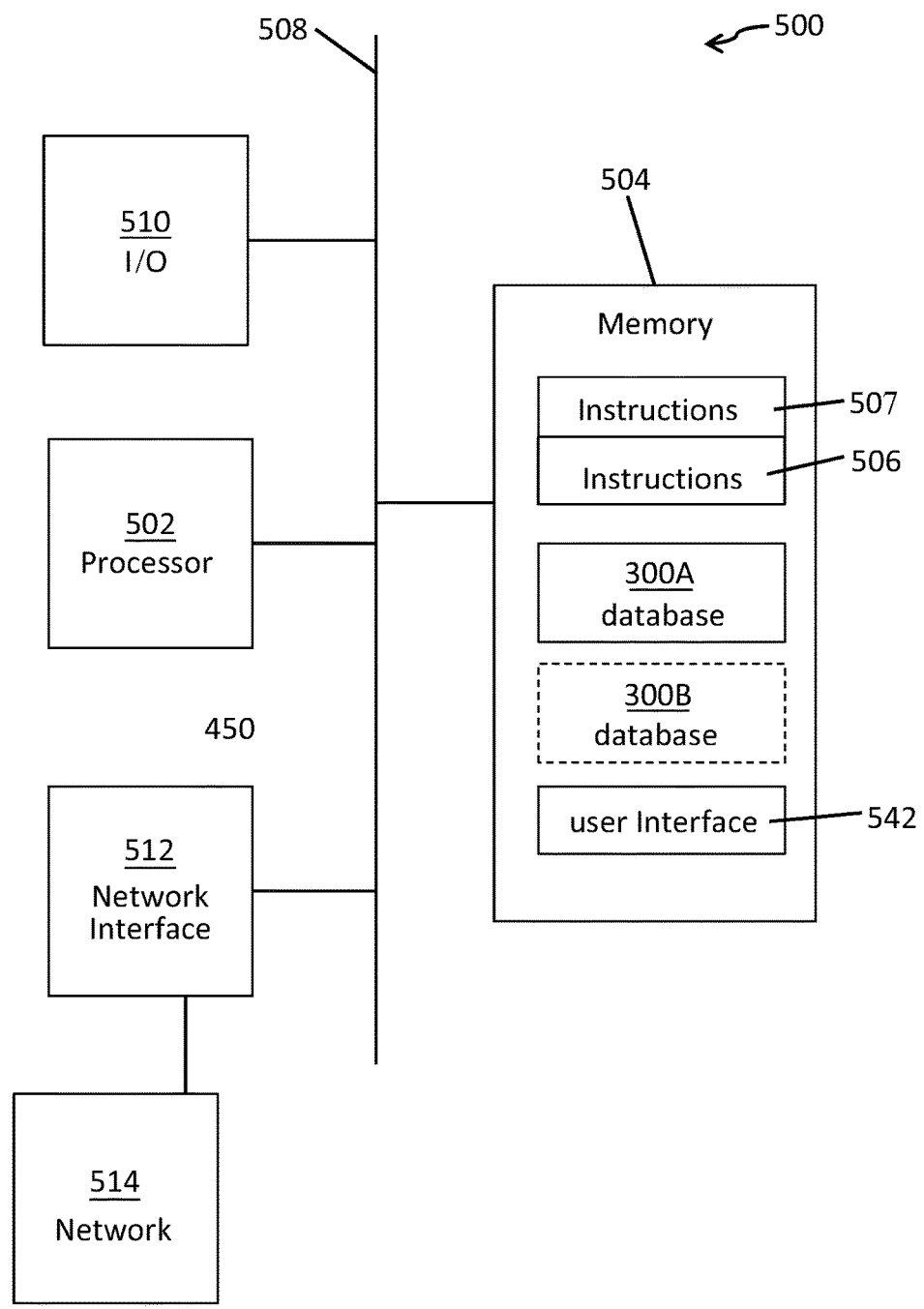
FIG. 5 is a block diagram of an EDA system in accordance with one or more embodiments.

FIG. 5 is a block diagram of an EDA system 500 in accordance with one or more embodiments.

In some embodiments, EDA system 900 is a general purpose computing device including a hardware processor 502 and a non-transitory, computer-readable storage medium 504. Storage medium 504, amongst other things, is encoded with, i.e., stores, computer program code 506, i.e., a set of executable instructions. Execution of instructions 506 by hardware processor 502 represents (at least in part) an EDA tool which implements a portion or all of the operations as described, e.g., in at least one of the method of FIG. 1A, the method of FIG. 1B, the method of FIG. 2A, the method of FIG. 2B, the method of FIG. 4A and/or the method of FIG. 4B in accordance with one or more embodiments.

In FIG. 5, storage medium 504, amongst other things, also is encoded with instructions 507 for interfacing with, e.g., manufacturing machines for producing the IC to which a dissectible design package of an IC, a corresponding pre-OPC design package of the IC and or the corresponding post-OPC design package of the IC relate. Processor 502 is electrically coupled to computer-readable storage medium 504 via a bus 508. Processor 502 is also electrically coupled to an I/O interface 510 by bus 508. A network interface 512 is also electrically connected to processor 502 via bus 508. Network interface 512 is connected to a network 514, so that processor 502 and computer-readable storage medium 504 are capable of connecting to external elements via network 514. Processor 502 is configured to execute computer program code 506 encoded in computer-readable storage medium 504 in order to cause system 500 (where such execution represents (at least in part) the EDA tool) to be usable for performing a portion or all of the operations as described, e.g., in at least one of the methods of FIGS. 1A-1B, 2A-2B, 4A and/or 4B. In one or more embodiments, processor 502 is a central processing unit (CPU), a multi-processor, a distributed processing system, an application specific integrated circuit (ASIC), and/or a suitable processing unit.

In one or more embodiments, computer-readable storage medium 504 is an electronic, magnetic, optical, electromagnetic, infrared, and/or a semiconductor system (or apparatus or device). For example, computer-readable storage medium 504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 504 includes a compact disk-read only memory (CD-ROM), a compact disk-read/write (CD-R/W), and/or a digital video disc (DVD).

In one or more embodiments, storage medium 504 stores computer program code 506 configured to cause system 500 (where such execution represents (at least in part) the EDA tool) to be usable for performing a portion or all of the operations as described, e.g., in at least one of the methods of FIGS. 1A-1B, 2A-2B, 4A and/or 4B. In one or more embodiments, storage medium 504 also stores information which facilitates performing a portion or all of the operations as described, e.g., in at least one of the methods of FIGS. 1A-1B, 2A-2B, 4A and/or 4B. In some embodiments, UI 542 is a graphical user interface (GUI).

In one or more embodiments, storage medium 504 stores instructions 507 for interfacing with external machines. Instructions 507 enable processor 502 to generate instructions readable by the external machines to effectively implement a portion or all of the operations as described, e.g., in at least one of the above-noted methods. Instructions 507 enable processor 502 to generate instructions readable by the external machines to effectively implement a portion or all of the operations as described, e.g., in at least one of the above-noted methods.

EDA system 500 includes I/O interface 510. I/O interface 510 is coupled to external circuitry. In one or more embodiments, I/O interface 610 includes a keyboard, keypad, mouse, trackball, trackpad, touchscreen, and/or cursor direction keys for communicating information and commands to processor 502.

EDA system 500 also includes network interface 512 coupled to processor 502. Network interface 512 allows system 500 to communicate with network 514, to which one or more other computer systems are connected. Network interface 512 includes wireless network interfaces such as BLUETOOTH, WIFI, WIMAX, GPRS, or WCDMA; or wired network interfaces such as ETHERNET, USB, or IEEE-1364. In one or more embodiments, a portion or all of the operations as described, e.g., in at least one of the above-noted methods is implemented in two or more systems 500, and information such as database 300A or database 300B are exchanged between different systems 500 via network 514.

System 500 is configured to receive information such as would be found in databases 300A or 300B and/or a dissectible design package through I/O interface 510. The information is transferred to processor 502 via bus 508. EDA system 500 is configured to receive information related to a UI through I/O interface 510. The information is stored in computer-readable medium 504 as UI 542.

In some embodiments, a portion or all of the operations as described, e.g., in at least one of the above-noted methods is implemented as a standalone software application for execution by a processor. In some embodiments, a portion or all of the operations as described, e.g., in at least one of the above-noted methods is implemented as a software application that is a part of an additional software application. In some embodiments, a portion or all of the operations as described, e.g., in at least one of the above-noted methods is implemented as a plug-in to a software application. In some embodiments, at least one of the methods of FIGS. 1A-1B, 2A-2B, 4A and/or 4B is implemented as a software application that is a portion of an EDA tool. In some embodiments, a portion or all of the operations as described, e.g., in at least one of the methods of FIGS. 1A-1B, 2A-2B, 4A and/or 4B is implemented as a software application that is used by EDA system 500. In some embodiments, a pre-OPC design package is generated using a tool such as VIR-TUOSO® available from CADENCE DESIGN SYSTEMS, Inc., or another suitable layout generating tool.

One of ordinary skill in the art would recognize that operations are able to be removed or that additional operations are able to be added to at least one of the above-noted methods without departing from the scope of this description. One of ordinary skill in the art would also recognize that an order of operations in at least one of the above-noted methods is able to be adjusted without departing from the scope of this description.

A first additional aspect of this description relates to a method of seeding an optical proximity correction (OPC) process. Such a method includes: receiving, at an input device of a computer, a subject pre-OPC design-signature for a subject pre-OPC design package; selecting, by the processor and via interaction with an OPC database operatively connected to the computer, one amongst archived post-OPC design packages based on relatedness between the subject pre-OPC design-signature and archived post-OPC design-signatures corresponding to the archived post-OPC design packages, and thereby retrieving the selected archived post-OPC design packages; and generating one or more seeds for the OPC process based on the selected archived post-OPC design package.

A second additional aspect of this description relates to a computer-readable medium including comprising computer-executable instructions for carrying out a method of seeding an optical proximity correction (OPC) process. Such a method includes: interfacing, with an input device of a computer, thereby to receive a subject pre-OPC design-signature for a subject pre-OPC design package; making, by the processor and via interaction with an OPC database operatively connected to the computer, comparisons between the subject pre-OPC design-signature and archived post-OPC design-signatures; selecting, by the processor, one amongst the archived post-OPC design-signatures based on the comparisons and thereby retrieving a selected one amongst archived post-OPC design packages corresponding to the archived post-OPC design-signatures; and generating one or more seeds for the OPC process based on the selected archived post-OPC design package.

A third additional aspect of this description relates to a system for seeding an optical proximity correction (OPC) process. Such a system includes: at least one processor; and at least one memory including computer program code for one or more programs. For such a system, the at least one memory, the computer program code and the at least one processor are configured to cause the system to: receive, at an input device of a computer, a subject pre-OPC design-signature for a subject pre-OPC design package; select, by the processor and via interaction with an OPC database operatively connected to the computer, one amongst archived post-OPC design packages based on relatedness between the subject pre-OPC design-signature and archived post-OPC design-signatures corresponding to the archived post-OPC design packages, and thereby retrieving the selected archived post-OPC design packages; generate one or more seeds for the OPC process based on the selected archived post-OPC design package; revise at least some default coefficients based on the one or more seeds; and perform the OPC process on the subject pre-OPC design package according to the revised coefficients; wherein an unseeded performance of the OPC process would otherwise be performed according to the default coefficients.

A fourth additional aspect of this description relates to a method of populating an optical proximity correction (OPC) database. Such a method includes: generating, by a processor of the computer, a pre-OPC design-signature for a pre-OPC design package of an integrated circuit (IC); generating, by the processor, a post-OPC design-signature for the post-OPC design package; and storing, by the processor and into an OPC database operatively connected to the computer, at least (A) the pre-OPC design-signature and (B) the post-OPC design-signature, (C) a data structure linking the pre-OPC design-signature and the post-OPC design-signature; and a data structure linking the post-OPC design-signature and the post-OPC design package.

A fifth additional aspect of this description relates to a computer readable medium including computer executable instructions for carrying out such a method of populating an OPC database as in the fourth additional aspect. A sixth aspect of this description relates to a system for populating an OPC database. Such a system, for example, includes: at least one processor; and at least one memory including computer program code for one or more programs; wherein the at least one memory and the computer program code are configured to, with the at least one processor, cause the system to carrying out such a method of populating an OPC database as in the fourth additional aspect:

For example, such a method (as in the fourth additional aspect) further includes: receiving, at an input device of a computer, a pre-OPC design package of an integrated circuit (IC) including at least one cell-based representation of a pre-OPC layout-layer; and receiving, at an input device of a computer, a corresponding post-OPC design package of the IC including at least one cell-based representation of a post-OPC layout-layer. For example, such a method (as in the fourth additional aspect) further includes also storing, by the processor and into the OPC database, the post-OPC design package.

In such a method (as in the fourth additional aspect), for example, the pre-OPC design-signature is based on the at least one cell-based representation of the pre-OPC layout-layer, and the post-OPC design-signature is based on the at least one cell-based representation of the post-OPC layout-layer. In such a method (as in the fourth additional aspect), for example, each of the at least one pre-OPC layout-layer includes a plurality of independent cells; each of the at least one post-OPC layout-layer includes a plurality of independent cells; the pre-OPC design-signature is based on signatures of the plurality of independent cells in each of the at least one pre-OPC layout-layer; and the post-OPC design-signature is based on signatures of the plurality of independent cells in each of the at least one post-OPC layout-layer.

In such a method (as in the fourth additional aspect), for example: the generating a pre-OPC design-signature for the pre-OPC design package includes (A) generating, by the processor and for each of the at least one pre-OPC layout-layer, a pre-OPC layer-signature, and (B) generating, by the processor, the pre-OPC design-signature based on the at least one pre-OPC layer-signature; the generating a post-OPC design-signature for the post-OPC design package includes: (A) generating, by the processor and for each of the at least one post-OPC layout-layer, a post-OPC layer-signature, and (B) generating, by the processor, the post-OPC design-signature based on the at least one post-OPC layer-signature; and the method further comprises appending, by the processor, the OPC database to further include (A) at least one data structure linking the pre-OPC design-signature and the corresponding at least one pre-OPC layer-signature, (B) at least one data structure linking the post-OPC design-signature and the corresponding at least one post-OPC layer-signature, (C) and at least one data structure linking the at least one pre-OPC layer-signature and the corresponding at least one post-OPC layer-signature. In such a method (as in the fourth additional aspect), for example, each of the at least one pre-OPC layout-layer includes a plurality of independent cells, each of the at least one post-OPC layout-layer includes a plurality of independent cells, each pre-OPC layer-signature is based on signatures of the plurality of independent cells in the corresponding pre-OPC layout-layer, and each post-OPC layer-signature is based on signatures of the plurality of independent cells in the corresponding post-OPC layout-layer.

An additional seventh aspect of this description relates to a method of seeding an optical proximity correction (OPC) process. Such a method includes: receiving, at an input device of a computer, a subject pre-OPC layer-signature for a subject pre-OPC layout-layer; selecting, by the processor and via interaction with an OPC database operatively connected to the computer, one amongst archived post-OPC layout-layers based on relatedness between the subject pre-OPC layer-signature and archived post-OPC layer-signatures corresponding to the archived post-OPC layout-layers, and thereby retrieving the corresponding selected archived post-OPC layout-layer; and generating, by the processor, one or more seeds for the OPC process based on the selected archived post-OPC layout-layer.

A eighth additional aspect of this description relates to a computer readable medium including computer executable instructions for carrying out such a method of populating an OPC database as in the seventh additional aspect. A ninth additional aspect of this description relates to a system for populating an OPC database. Such a system, for example, includes: at least one processor; and at least one memory including computer program code for one or more programs; wherein the at least one memory and the computer program code are configured to, with the at least one processor, cause the system to carrying out such a method of populating an OPC database as in the seventh additional aspect.

For example, such a method (as in the seventh additional aspect) further includes providing the OPC database, wherein the OPC database includes: the archived cell-based representations of post-OPC layout-layers for integrated circuits (ICs); the archived post-OPC layer-signatures corresponding to the archived post-OPC layout-layers; the archived pre-OPC layer-signatures corresponding to the archived post-OPC layer-signatures; data structures linking the archived post-OPC layout-layers and the corresponding archived post-OPC layer-signatures; and data structures linking the archived post-OPC layer-signatures and the corresponding archived pre-OPC layer-signatures. In such a method (as in the seventh additional aspect), for example, the receiving a subject pre-OPC design-signature includes: receiving, at the input device of the computer, a subject cell-based representation of the pre-OPC layout-layer; and generating, by the processor of the computer, the subject pre-OPC layer-signature based on the pre-OPC layout-layer.

In such a method (as in the seventh additional aspect), for example, the selecting includes: making comparisons, by the processor, between the subject pre-OPC layer-signature and the archived post-OPC layer-signatures; selecting, by the processor, one of the archived post-OPC layer-signatures based on the comparisons; and indexing, by the processor, the selected archived post-OPC layer-signature into the OPC database and thereby retrieving the corresponding archived post-OPC layout-layer as the selected post-OPC layout-layer. In such a method (as in the seventh additional aspect), for example, the making comparisons includes looking for an identical match between the subject pre-OPC design-signature and one of the archived post-OPC design-signatures; and the selecting includes choosing, if an identical match is found, the corresponding archived post-OPC design-signature to be the selected one of the archived post-OPC design-signatures.

In such a method (as in the seventh additional aspect), for example, the making comparisons includes applying, for each of the archived post-OPC design-signatures, a closeness function to the subject pre-OPC design-signature and the post-OPC design-signature to obtain a corresponding closeness value, and the selecting includes: sorting the closeness values to find a closest one thereof and thereby the corresponding archived post-OPC design-signature; and choosing the closest-value-corresponding archived post-OPC design-signature to be the selected one of the archived post-OPC design-signatures. In such a method (as in the seventh additional aspect), for example, the closeness function is a string metric such that the closeness value is a string-distance, the making comparisons includes applying, for each of the archived post-OPC design-signatures, the string metric to the subject pre-OPC design-signature and the post-OPC design-signature to obtain the corresponding string-distance, and the selecting includes: sorting the string-distances to find a shortest one thereof and thereby the corresponding archived post-OPC design-signature; and choosing the shortest string-distance-corresponding archived post-OPC design-signature to be the selected one of the archived post-OPC design-signatures.

In such a method (as in the seventh additional aspect), for example, an unseeded performance of the OPC process would otherwise be performed according to default coefficients, and the method further includes: revising at least some of the default coefficients based on the one or more seeds; and performing the OPC process on the subject pre-OPC design package according to the revised coefficients.

In such a method (as in the seventh additional aspect), for example, the at least one cell-based representation of a post-OPC layout-layer is a hierarchy of cells in which: a cell including no other cells is a basic layout element (BLE); a first cell including one or more BLEs and/one or more second cells is a nestor cell such the one or more BLEs included therein are nestee BLEs and/or the one or more second cells included therein are nestee cells; an instance of a nestor cell can include one or more instances of a nestor cell; a BLE that is not a nestee BLE is an independent cell; a nestor cell that is not a nestee BLE is an independent cell; and, as such, a post-OPC layout-layer is a hierarchical collection of BLEs. In such a method (as in the seventh additional aspect), for example, each BEL is represented by one or more segments, each segment is associated with a model-OPC bias value, and the generating one or more seeds for the OPC process includes setting, for each BLE in the post-OPC layout-layer, the model-OPC bias value for each of the one or more segments in the BLE as corresponding one or more seeds for the OPC process based on the selected archived post-OPC design package.

A tenth additional aspect of this description relates to method of populating an OPC database. Such a method includes: generating, by a processor of the computer and for each of the at least one pre-OPC layout-layer, a pre-OPC layer-signature; generating, by the processor and for each of the at least one post-OPC layout-layer, a post-OPC layer-signature; and storing, by the processor and into the OPC database operatively connected to the computer, at least (A) the at least one pre-OPC layer-signature (B) the at least one post-OPC layer-signature, (C) at least one data structure linking the at least one pre-OPC layer-signature and the corresponding at least one post-OPC layer-signature, and (D) at least one data structure linking the at least one post-OPC layer-signature and the at least one post-OPC layout-layer.

An eleventh additional aspect of this description relates to a computer readable medium including computer executable instructions for carrying out such a method of populating an OPC database as in the tenth additional aspect. A twelfth additional aspect of this description relates to a system for populating an OPC database. Such a system, for example, includes: at least one processor; and at least one memory including computer program code for one or more programs; wherein the at least one memory and the computer program code are configured to, with the at least one processor, cause the system to carrying out such a method of populating an OPC database as in the tenth additional aspect.

Such a method (as in the seventh additional aspect), for example, further includes: receiving, at an input device of a computer, a pre-OPC design package of an integrated circuit (IC) including at least one cell-based representation of a pre-OPC layout-layer; and receiving, at an input device of a computer, a corresponding post-OPC design package of the IC including at least one cell-based representation of a post-OPC layout-layer. For example, such a method (as in the seventh additional aspect) further includes also storing the at least one post-OPC layout-layer.

In such a method (as in the seventh additional aspect), for example: each of the at least one pre-OPC layout-layer includes a plurality of independent cells; each of the at least one post-OPC layout-layer includes a plurality of independent cells; each pre-OPC layer-signature is based on signatures of the plurality of independent cells in the corresponding pre-OPC layout-layer; and each post-OPC layer-signature is based on signatures of the plurality of independent cells in the corresponding post-OPC layout-layer.

For example, such a method (as in the seventh additional aspect) further includes also storing, by the processor and into the OPC database, the at least one post-OPC layout-layer.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of seeding execution of an optical proximity correction (OPC) process, the method comprising:
    receiving, at an input device of a computer, a subject pre-OPC design-signature for a subject pre-OPC design package;
    selecting, by a processor of the computer and via interaction with an OPC database operatively connected to the computer, one amongst archived post-OPC design packages based on relatedness between the subject pre-OPC design-signature and archived post-OPC design-signatures corresponding to the archived post-OPC design packages, and thereby retrieving the selected archived post-OPC design package;
    generating one or more seeds for use by the OPC process based on the selected archived post-OPC design package; and
    performing at least one of the following including:
        making one or more lithographic exposures based on a seeded post-OPC design package resulting from having performed the OPC process on the subject pre-OPC design package according to the one or more seeds;
        fabricating, based on the seeded post-OPC design package, one or more semiconductor masks; or
        fabricating, based on the seeded post-OPC design package, at least one component in a layer of a semiconductor integrated circuit.

2. The method of claim 1, wherein the OPC database includes:
    the archived post-OPC design packages of integrated circuits (ICs), each post OPC-design package including at least one cell-based representation of a post-OPC layout-layer;
    the archived post-OPC design-signatures corresponding to the archived post-OPC design packages;
    archived pre-OPC design-signatures of pre-OPC design packages of ICs corresponding to the archived post-OPC design-signatures;
    data structures linking the archived post-OPC design packages and the corresponding archived post-OPC design-signatures; and
    data structures linking the archived post-OPC design-signatures and corresponding archived pre-OPC design-signatures.

3. The method of claim 1, wherein the receiving a subject pre-OPC design-signature includes:
    generating, by the processor of the computer, the subject pre-OPC design-signature based on the subject pre-OPC design package, wherein the subject pre-OPC design package including at least one cell-based representation of a pre-OPC layout-layer.

4. The method of claim 1, wherein the selecting includes:
    making comparisons, by the processor, between the subject pre-OPC design-signature and the archived post-OPC design-signatures;
    selecting, by the processor, one of the archived post-OPC design-signatures based on the comparisons;
    indexing, by the processor, the selected archived post-OPC design-signature into the OPC database and thereby retrieving the corresponding archived post-OPC design package as the selected post-OPC design package.

5. The method of claim 4, wherein:
    the making comparisons includes:
        looking for an identical match between the subject pre-OPC design-signature and one of the archived post-OPC design-signatures; and
    the selecting includes:
        choosing, if an identical match is found, the corresponding archived post-OPC design-signature to be the selected one of the archived post-OPC design-signatures.

6. The method of claim 4, wherein:
the making comparisons includes:
applying, for each of the archived post-OPC design-signatures, a closeness function to the subject pre-OPC design-signature and the post-OPC design-signature to obtain a corresponding closeness value; and
the selecting includes:
sorting the closeness values to find a closest one thereof and thereby the corresponding archived post-OPC design-signature; and
choosing the closest-value-corresponding archived post-OPC design-signature to be the selected one of the archived post-OPC design-signatures.

7. The method of claim 6, wherein:
the closeness function is a string metric such that the closeness value is a string-distance;
the making comparisons includes:
applying, for each of the archived post-OPC design-signatures, the string metric to the subject pre-OPC design-signature and the post-OPC design-signature to obtain the corresponding string-distance; and
the selecting includes:
sorting the string-distances to find a shortest one thereof and thereby the corresponding archived post-OPC design-signature; and
choosing the shortest string-distance-corresponding archived post-OPC design-signature to be the selected one of the archived post-OPC design-signatures.

8. The method of claim 1, wherein the method further comprises:
revising at least some default coefficients based on the one or more seeds; and
performing the OPC process on the subject pre-OPC design package according to the revised coefficients.

9. The method of claim 1, wherein:
the at least one cell-based representation of a post-OPC layout-layer is a hierarchy of cells in which:
a cell including no other cells is a basic layout element (BLE);
a first cell including one or more BLEs and/or one or more second cells is a nestor cell such that the one or more BLEs included therein are nestee BLEs and/or the one or more second cells included therein are nestee cells;
an instance of a nestor cell can include one or more instances of a nestor cell;
a BLE that is not a nestee BLE is an independent cell;
a nestor cell that is not a nestee BLE is an independent cell; and
a post-OPC layout-layer is a hierarchical collection of BLEs;
each BLE is represented by one or more segments;
each segment is associated with a model-OPC bias value; and
the generating one or more seeds for the OPC process includes:
setting, for each BLE in the post-OPC layout-layer, the model-OPC bias value for each of the one or more segments in the BLE as corresponding one or more seeds for the OPC process based on the selected archived post-OPC design package.

10. A method of seeding execution of an optical proximity correction (OPC) process, the method comprising:
interfacing, with an input device of a computer, thereby to receive a subject pre-OPC design-signature for a subject pre-OPC design package;
making, via interaction with an OPC database operatively connected to the computer, comparisons between the subject pre-OPC design-signature and archived post-OPC design-signatures;
selecting one amongst the archived post-OPC design-signatures based on the comparisons and thereby retrieving a selected one amongst the archived post-OPC design packages corresponding to the archived post-OPC design-signatures;
generating one or more seeds for the OPC process based on the selected archived post-OPC design package;
revising at least some default coefficients based on the one or more seeds;
performing the OPC process on the subject pre-OPC design package according to the revised coefficients;
wherein at least one of the making, selecting, generating, revising and performing is executed by a processor of the computer; and
performing at least one of the following including:
making one or more lithographic exposures based on a seeded post-OPC design package resulting from having performed the OPC process on the subject pre-OPC design package according to the one or more seeds;
fabricating, based on the seeded post-OPC design package, one or more semiconductor masks; or
fabricating, based on the seeded post-OPC design package, at least one component in a layer of a semiconductor integrated circuit.

11. The method of claim 10, wherein the OPC database includes:
the archived post-OPC design packages of integrated circuits (ICs), each post OPC-design package including at least one cell-based representation of a post-OPC layout-layer;
the archived post-OPC design-signatures corresponding to the archived post-OPC design packages;
archived pre-OPC design-signatures of pre-OPC design packages of ICs corresponding to the archived post-OPC design-signatures; and
data structures linking the archived post-OPC design packages and the corresponding archived post-OPC design-signatures; and
data structures linking the archived post-OPC design-signatures and corresponding archived pre-OPC design-signatures.

12. The method of claim 10, wherein the receiving a subject pre-OPC design-signature includes:
receiving, at the input device of a computer, the subject pre-OPC design package including at least one cell-based representation of a pre-OPC layout-layer; and
generating, by the processor of the computer, the subject pre-OPC design-signature based on the subject pre-OPC design package.

13. The method of claim 10, wherein:
the OPC database includes data structures linking the archived post-OPC design-signatures and corresponding ones of the archived post-OPC design packages; and
the selecting includes:
indexing, by the processor, the selected archived post-OPC design-signature into the OPC database and thereby retrieving one of the archived post-OPC design packages corresponding to the selected archived post-OPC design-signature as the selected post-OPC design package.

14. The method of claim 10, wherein:
the making comparisons includes:
  looking for an identical match between the subject pre-OPC design-signature and one of the archived post-OPC design-signatures; and
the selecting includes:
  choosing, if an identical match is found, the corresponding archived post-OPC design-signature to be the selected one of the archived post-OPC design-signatures.

15. The method of claim 10, wherein:
the making comparisons includes:
  applying, for each of the archived post-OPC design-signatures, a closeness function to the subject pre-OPC design-signature and the post-OPC design-signature to obtain a corresponding closeness value; and
the selecting includes:
  sorting the closeness values to find a closest one thereof and thereby the corresponding archived post-OPC design-signature; and
  choosing the closest-value-corresponding archived post-OPC design-signature to be the selected one of the archived post-OPC design-signatures.

16. The method of claim 15, wherein:
the closeness function is a string metric such that the closeness value is a string-distance;
the making comparisons includes:
  applying, for each of the archived post-OPC design-signatures, the string metric to the subject pre-OPC design-signature and the post-OPC design-signature to obtain the corresponding string-distance; and
the selecting includes:
  sorting the string-distances to find a shortest one thereof and thereby the corresponding archived post-OPC design-signature; and
  choosing the shortest string-distance-corresponding archived post-OPC design-signature to be the selected one of the archived post-OPC design-signatures.

17. The method of claim 10, wherein:
the at least one cell-based representation of a post-OPC layout-layer is a hierarchy of cells in which:
  a cell including no other cells is a basic layout element (BLE);
  a first cell including one or more BLEs and/or one or more second cells is a nestor cell such the one or more BLEs included therein are nestee BLEs and/or the one or more second cells included therein are nestee cells;
  an instance of a nestor cell can include one or more instances of a nestor cell;
  a BLE that is not a nestee BLE is an independent cell;
  a nestor cell that is not a nestee BLE is an independent cell; and
  a post-OPC layout-layer is a hierarchical collection of BLEs;
each BLE is represented by one or more segments;
each segment is associated with a model-OPC bias value; and
the generating one or more seeds for the OPC process includes:
  setting, for each BLE in the post-OPC layout-layer, the model-OPC bias value for each of the one or more segments in the BLE as corresponding one or more seeds for the OPC process based on the selected archived post-OPC design package.

18. A system for seeding execution of an optical proximity correction (OPC) process, the system comprising:
at least one processor;
at least one memory including computer program code for one or more programs;
wherein the at least one memory, the computer program code and the at least one processor are configured to cause the system to:
  receive, at an input device of a computer, a subject pre-OPC design-signature for a subject pre-OPC design package;
  select, by the processor and via interaction with an OPC database operatively connected to the computer, one amongst archived post-OPC design packages based on relatedness between the subject pre-OPC design-signature and archived post-OPC design-signatures corresponding to the archived post-OPC design packages, and thereby retrieving the selected archived post-OPC design package;
  generate one or more seeds for the OPC process based on the selected archived post-OPC design package;
  revise at least some default coefficients based on the one or more seeds; and
  perform the OPC process on the subject pre-OPC design package according to the revised coefficients; and
at least one of the following including:
  a first facility to make one or more lithographic exposures based on a seeded post-OPC design package resulting from having performed the OPC process on the subject pre-OPC design package according to the one or more seeds;
  a second facility to fabricate, based on the seeded post-OPC design package, one or more semiconductor masks; or
  a third facility to fabricate, based on the seeded post-OPC design package, at least one component in a layer of a semiconductor integrated circuit.

19. The system of claim 18, wherein regarding the selection, the at least one memory, the computer program code and the at least one processor are further configured to cause the system to:
  make comparisons between the subject pre-OPC design-signature and the archived post-OPC design-signatures;
  select one of the archived post-OPC design-signatures based on the comparisons; and
  index the selected archived post-OPC design-signature into the OPC database and thereby retrieve the corresponding archived post-OPC design package as the selected post-OPC design package.

20. The system of claim 19, wherein:
regarding the comparison, the at least one memory, the computer program code and the at least one processor are further configured to cause the system to:
  apply, for each of the archived post-OPC design-signatures, a closeness function to the subject pre-OPC design-signature and the post-OPC design-signature to obtain a corresponding closeness value; and
regarding the selection, the at least one memory, the computer program code and the at least one processor are further configured to cause the system to:
  sort the closeness values to find a closest one thereof and thereby the corresponding archived post-OPC design-signature; and choose the closest-value-corresponding archived post-OPC design-signature to be the selected one of the archived post-OPC design-signatures.

\* \* \* \* \*